(12) United States Patent
Kim et al.

(10) Patent No.: US 12,507,585 B2
(45) Date of Patent: Dec. 23, 2025

(54) DISPLAY APPARATUS

(71) Applicant: LG Display Co., Ltd., Seoul (KR)

(72) Inventors: Giyoun Kim, Goyang-si (KR); Yeonjae Jeong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 384 days.

(21) Appl. No.: 18/229,923

(22) Filed: Aug. 3, 2023

(65) Prior Publication Data
US 2024/0188412 A1 Jun. 6, 2024

(30) Foreign Application Priority Data
Dec. 6, 2022 (KR) .......................... 10-2022-0168756

(51) Int. Cl.
*H10K 77/10* (2023.01)
*H10K 59/131* (2023.01)
*H10K 59/80* (2023.01)
*H10K 102/00* (2023.01)

(52) U.S. Cl.
CPC ......... *H10K 77/111* (2023.02); *H10K 59/131* (2023.02); *H10K 59/8722* (2023.02); *H10K 2102/311* (2023.02)

(58) Field of Classification Search
CPC .............. H10K 77/111; H10K 59/131; H10K 59/8722; H10K 2102/311; H10K 59/18; H10K 59/127; H10D 86/411; H10D 86/441; H10H 20/8506; H10H 29/142; H01L 25/0753
See application file for complete search history.

(56) References Cited

U.S. PATENT DOCUMENTS

2019/0165311 A1* 5/2019 Lee ........................... B32B 7/14

FOREIGN PATENT DOCUMENTS

| KR | 10-2020-0059141 A | 5/2020 |
| KR | 10-2022-0067458 A | 5/2022 |

* cited by examiner

*Primary Examiner* — Kevin Quarterman
(74) *Attorney, Agent, or Firm* — Birch, Stewart, Kolasch & Birch, LLP

(57) ABSTRACT

A display apparatus can include a first substrate having a plurality of first areas and a plurality of second areas adjacent to the plurality of first areas, a second substrate disposed in the plurality of first areas, a connection substrate disposed in the plurality of second areas, a light emitting diode disposed over the second substrate, a connection line disposed over the connection substrate, a first adhesive member disposed over the connection line and having elastic hollow particles, a second adhesive member disposed over the light emitting diode and the first adhesive member, and a third substrate disposed over the second adhesive member.

20 Claims, 8 Drawing Sheets

| EVALUATION CONDITION | | | EVALUATION RESULT | | |
|---|---|---|---|---|---|
| EXPERIMENTAL EXAMPLE(#) | SIZE (INNER DIAMETER, nm) | CONTENT RATIO (wt%) | ELASTIC MODULUS (G', ROOM TEMPERATURE) | T (%) | HAZE |
| 1 | 40 | 30 | $4\times10^4$ Pa | 70 | 10 |
| 2 | 40 | 45 | $8\times10^4$ Pa | 80 | 5 |
| 3 | 40 | 60 | $5\times10^5$ Pa | 90 | 0.7 |
| 4 | 40 | 75 | $1\times10^6$ Pa | 92 | 0.3 |
| 5 | 60 | 30 | $4\times10^4$ Pa | 75 | 10 |
| 6 | 60 | 45 | $8\times10^4$ Pa | 82 | 6 |
| 7 | 60 | 60 | $1\times10^5$ Pa | 91 | 1 |
| 8 | 60 | 75 | $4\times10^5$ Pa | 93 | 0.3 |
| 9 | 100 | 30 | $4\times10^4$ Pa | 78 | 9 |
| 10 | 100 | 45 | $6\times10^4$ Pa | 85 | 4 |
| 11 | 100 | 60 | $9\times10^4$ Pa | 92 | 0.7 |
| 12 | 100 | 75 | $1\times10^5$ Pa | 95 | 0.3 |

FIG. 6

DISPLAY APPARATUS

CROSS-REFERENCE TO RELATED APPLICATIONS

This application claims priority to Korean Patent Application No. 10-2022-0168756 filed on Dec. 6, 2022 in the Republic of Korea, the entire contents of which is hereby expressly incorporated by reference into the present application.

BACKGROUND

Field

The present disclosure relates to a display apparatus, especially, to a stretchable display apparatus which enhances resilience.

Discussion of the Related Art

As display apparatuses which are used for a monitor of a computer, a television, or a cellular phone, there are an organic light emitting display (OLED) device which is a self-emitting device and a liquid crystal display (LCD) device which requires a separate light source.

An applicable range of the display apparatus is diversified to include personal digital assistants as well as monitors of computers and televisions, and a display apparatus with a large display area and a reduced volume and weight is being studied.

Recently, a flexible display apparatus, which is manufactured by forming a display part and a wiring line on a flexible substrate such as plastic being a flexible material so as to be stretchable in a specific direction and changed in various forms, is getting attention as a next generation display apparatus.

SUMMARY OF THE DISCLOSURE

An aspect of an embodiment of the present disclosure is to provide a display apparatus or a stretchable display apparatus which enhances resilience against the deformation during the stretching and a line stretching reliability.

Another aspect of an exemplary embodiment of the present disclosure is to provide a display apparatus or a stretchable display apparatus which improves a Z-axis deformation generated during the process.

Additional features, advantages, and aspects of the present disclosure are set forth in part in the present disclosure and will also be apparent from the present disclosure or can be learned by practice of the inventive concepts provided herein. Other features, advantages, and aspects of the present disclosure can be realized and attained by the structure particularly pointed out in the present disclosure, or derivable therefrom, and claims hereof as well as the appended drawings.

To achieve these and other aspects of the present disclosure, as embodied and broadly described herein, in one or more aspects, a display apparatus can include a first substrate including a plurality of first areas and a plurality of second areas around or adjacent to the plurality of first areas, a second substrate disposed in the plurality of first areas, a connection substrate disposed in the plurality of second areas, a light emitting diode disposed over the second substrate, a connection line disposed over the connection substrate, a first adhesive member disposed over the connection line and including elastic hollow particles, a second adhesive member disposed over the light emitting diode and the first adhesive member, and a third substrate disposed over the second adhesive member.

According to another aspect of the present disclosure, a display apparatus can include a plurality of second substrates disposed over a first substrate, a plurality of connection substrates connected to the second substrates adjacent to each other among the plurality of second substrates, a plurality of connection lines disposed over the plurality of connection substrates and electrically connected to pads disposed in the second substrates being adjacent to each other, a first adhesive member disposed over the connection line and including elastic hollow particles, a second adhesive member including the first adhesive member disposed over the first substrate, and a third substrate disposed over the second adhesive member. The first adhesive member can include an adhesive having a shear modulus lower than that of the second adhesive member.

According to an exemplary embodiment of the present disclosure, an adhesive including hollow particles having a high recovery resilience is selectively configured in a flexible region of the display apparatus to enhance resilience for the stretching, thereby minimizing or reducing deformation to improve reliability.

According to an exemplary embodiment of the present disclosure, an adhesive including elastic hollow particles has a low shear modulus (e.g., modulus of rigidity) and an adhesive having a high shear modulus are applied together to ensure the stretching reliability and supplement the elasticity and improve the Z-axis deformation.

According to an exemplary embodiment of the present disclosure, an adhesive is printed with a large size by an inkjet method to optimize the process.

Other systems, methods, features, and advantages will be, or will become, apparent to one with skill in the art upon examination of the following figures and detailed description. It is intended that all such additional systems, methods, features, and advantages be included within this description, and be within the scope of the present disclosure, and be protected by the following claims. Nothing in this section should be taken as a limitation on those the claims. Further aspects and advantages are discussed below in conjunction with aspects of the disclosure.

It is to be understood that both the foregoing description and the following description of the present disclosure are by way of example and are intended to provide further explanation of the disclosure as claimed.

BRIEF DESCRIPTION OF THE DRAWINGS

The accompanying drawings, which are included to provide a further understanding of the disclosure and are incorporated in and constitute a part of this disclosure, illustrate aspects and embodiments of the disclosure and together with the description serve to explain principles of the disclosure.

FIG. 6 is a table showing examples of a shear modulus and a haze value of a first adhesive member according to a size of an elastic hollow particle and a mixing ratio.

Figure 1:
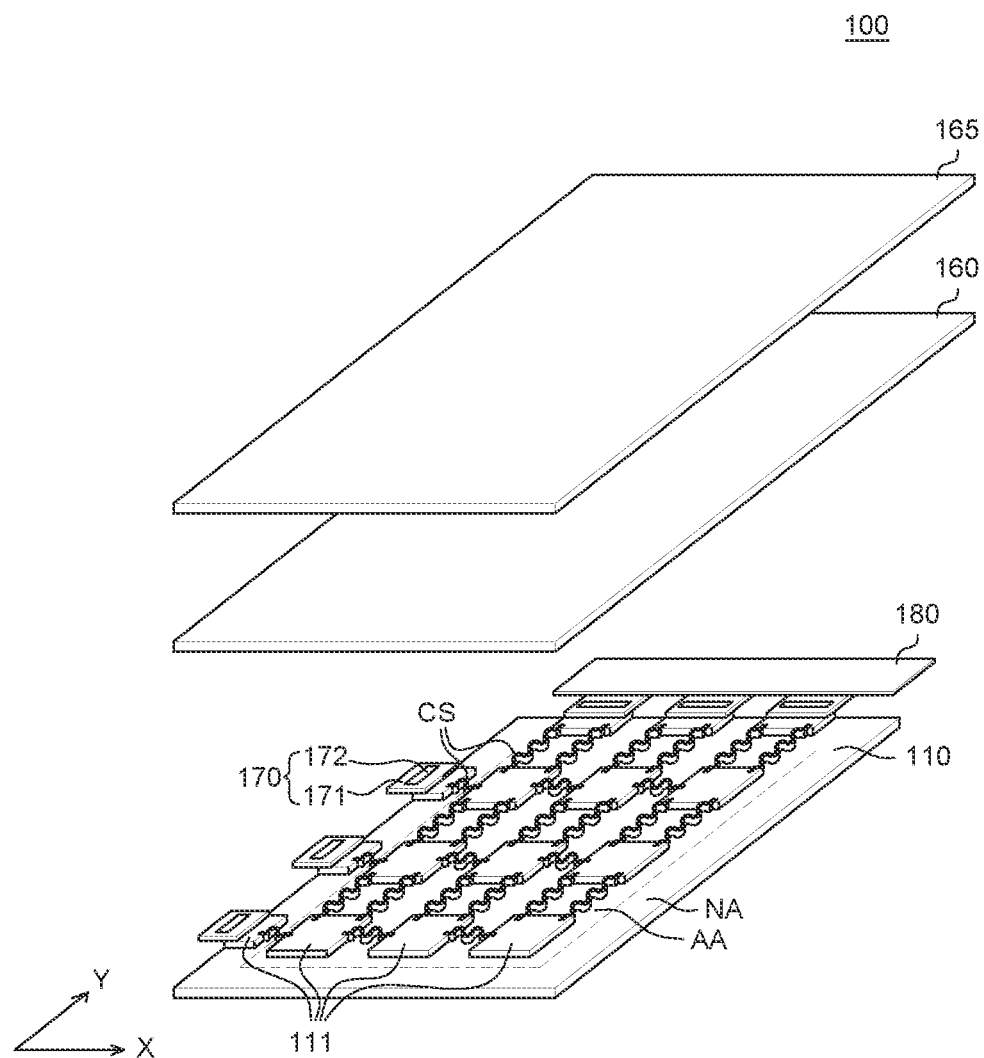
FIG. 1 is an exploded perspective view of a display apparatus according to an exemplary embodiment of the present disclosure.

Throughout the drawings and the detailed description, unless otherwise described, the same drawing reference numerals should be understood to refer to the same elements, features, or structures. The sizes, lengths, and thicknesses of layers, regions, and elements, and depiction thereof can be exaggerated for clarity, illustration, or convenience.

DETAILED DESCRIPTION OF THE EMBODIMENTS

Reference is now made in detail to embodiments of the present disclosure, examples of which can be illustrated in the accompanying drawings. In the following description, where a detailed description of relevant known functions or configurations can unnecessarily obscure aspects of the present disclosure, a detailed description of such known functions or configurations can be omitted for brevity. The progression of processing steps and/or operations described is an example, and the sequence of steps and/or operations is not limited to that set forth herein and can be changed, with the exception of steps and/or operations necessarily occurring in a particular order.

Advantages and features of the present disclosure, and implementation methods thereof are clarified through the following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to understand the inventive concepts fully without limiting the protected scope of the present disclosure.

The shapes, dimensions, areas, ratios, angles, numbers, and the like, which are illustrated in the drawings to describe various example embodiments of the present disclosure, are merely given by way of example. Therefore, the present disclosure is not limited to the illustrations in the drawings. Like reference numerals generally denote like elements throughout the specification, unless otherwise specified.

Where a term like "comprise," "have," "include," "contain," "constitute," "made up of," or "formed of," is used, one or more other elements can be added unless a more limiting term, such as "only" or the like, is used. The terms and names used in the present disclosure are merely used to describe particular embodiments, and are not intended to limit the scope of the present disclosure. An element described in the singular form is intended to include a plurality of elements, and vice versa, unless the context clearly indicates otherwise.

The word "exemplary" is used to mean serving as an example or illustration, unless otherwise specified. Embodiments are example embodiments. Aspects are example aspects. Any implementation described herein as an "example" is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range can be caused by various factors (e.g., process factors, internal or external impact, noise, or the like). Further, the term "may" encompasses all the meanings of the term "can."

In describing a positional relationship where the positional relationship between two parts is described, for example, using "on," "over," "under," "above," "below," "beneath," "near," "close to," "adjacent to," "beside," "next to," or the like, one or more other parts can be located between the two parts unless a more limiting term, such as "immediate(ly)," "direct(ly)," or "close(ly)," is used. For example, where a structure is described as being positioned "on," "over," "under," "above," "below," "beneath," "near," "close to," "adjacent to," "beside," or "next to," etc. another structure, this description should be construed as including a case in which the structures contact each other as well as a case in which one or more additional structures are disposed therebetween. Furthermore, the terms "front," "rear," "back," "left," "right," "top," "bottom," "downward," "upward," "upper," "lower," "up," "down," "column," "row," "vertical," "horizontal," and the like refer to an arbitrary frame of reference, unless otherwise specified.

In describing a temporal relationship, when where the temporal order is described as, for example, "after," "subsequent," "next," "before," "preceding," "prior to," or the like, a case that is not consecutive or not sequential can be included unless a more limiting term, such as "just," "immediate(ly)," or "direct(ly)," is used.

It will be understood that, although the terms "first," "second," or the like can be used herein to describe various elements, these elements should not be limited by these terms, for example, to any particular order, sequence, precedence, or number of elements. These terms are only used to distinguish one element from another. For example, a first element could be termed a second element, and, similarly, a second element could be termed a first element, without departing from the scope of the present disclosure. Furthermore, the first element, the second element, and the like can be arbitrarily named according to the convenience of those skilled in the art without departing from the scope of the present disclosure. The terms "first," "second," and the like can be used to distinguish components from each other, but the functions or structures of the components are not limited by ordinal numbers or component names in front of the components.

In describing the elements of the present disclosure, terms "first," "second," "A," "B," "(a)," "(b)," or the like can be used. These terms are intended to identify the corresponding element(s) from other element(s), and are not used to define the essence, basis, order, or number of the elements.

Where an element or layer is described to as "coupled," "connected," "attached," or "adhered" to another element or layer, the element or layer can not only be directly connected, coupled, attached, or adhered to another element or layer, but also be indirectly connected, coupled, attached, or adhered to another element or layer with one or more intervening elements or layers disposed or interposed between the elements or layers, unless otherwise specified.

The term "at least one" should be understood as including any and all combinations of one or more of the associated listed items. For example, the meaning of "at least one of a first item, a second item, and a third item" encompasses the combination of all three listed items, combination of any two of the first item, the second item, and the third item as well as any individual item, the first item, the second item, or the third item.

In one or more aspects, the terms "between" and "among" can be used interchangeably simply for convenience unless stated otherwise. For example, an expression "between a plurality of elements" can be understood as among a plurality of elements. In another example, an expression "among a plurality of elements" can be understood as between a plurality of elements. In one or more examples, the number of elements can be two. In one or more examples, the number of elements can be more than two.

In one or more aspects, the phrases "each other" and "one another" can be used interchangeably simply for convenience unless stated otherwise. For example, an expression "different from each other" can be understood as different from one another. In another example, an expression "different from one another" can be understood as different from each other. In one or more examples, the number of elements involved in the foregoing expression can be two. In one or more examples, the number of elements involved in the foregoing expression can be more than two.

In the present specification, a "display apparatus" (or "display device") can include a display apparatus which includes a display panel and a driver for driving the display panel, in a narrow sense, such as a liquid crystal module (LCM), an organic light emitting module (OLED module), and a quantum dot (QD) module. Further, the "display apparatus" (or "display device") can further include a set electronic apparatus or a set apparatus (or a set device) which is a complete product or a final product including an LCM, an OLED module, and a QD module, such as a laptop computer, a television, or a computer monitor, an automotive display apparatus or equipment display apparatus including another type of vehicle and a mobile electronic device including a smart phone or an electronic pad.

Accordingly, the display apparatus of the present disclosure can include not only a display apparatus itself in a narrow sense such as an LCM, an OLED module, and a QD module, but also an applied product or a set apparatus which is a final consumer device including the LCM, the OLED module, and the QD module.

Further, if necessary or desired, the LCM, the OLED module, or the QD module which is configured by a display panel and a driver is represented as a display apparatus in a narrow sense and an electronic device as a complete product including the LCM, the OLED module, and the QD module can also be represented as a "set apparatus". For example, the display apparatus in the narrow sense includes a liquid crystal (LCD) display panel, an OLED display panel, or a quantum dot display panel and a source printed circuit board (PCB) which is a controller for driving the display panel. In contrast, the set device can further include a set PCB which is a set controller which is electrically connected to the source PCB to control the entire set device.

As a display panel used in the exemplary embodiment of the present disclosure, any type of display panels such as a liquid crystal display panel, an organic light emitting diode (OLED) display panel, a quantum dot (QD) display panel, and an electroluminescent display panel can be used. The display panel of the present exemplary embodiment is not limited to a specific display panel in which bezel is bent by a flexible substrate for the organic light emitting diode (OLED) display panel and a back plate support structure therebelow. Further, a display panel used for the display apparatus according to the exemplary embodiment of the present disclosure is not limited to a shape or a size of the display panel.

For example, when the display panel is an OLED display panel, the display panel can include a plurality of gate lines and data lines, and pixels formed at intersecting areas of the gate lines and/or data lines. Further, the display panel can be configured to include an array including a thin film transistor which is an element to selectively apply a voltage to each pixel, a light emitting diode layer on the array, and an encapsulation substrate or an encapsulation layer disposed on the array so as to cover the light emitting diode layer. The encapsulation layer protects the thin film transistor and the light emitting diode layer from external impacts and can suppress the permeation of moisture or oxygen into the light emitting diode layer. Further, a layer formed on the array can include an inorganic light emitting layer, for example, a nano-sized material layer or quantum dots.

Features of various embodiments of the present disclosure can be partially or entirely coupled to or combined with each other and can be operated, linked, or driven together in various ways. Embodiments of the present disclosure can be carried out independently from each other, or can be carried out together in co-dependent or related relationship. In one or more aspects, the components of each apparatus according to various embodiments of the present disclosure are can be operatively coupled and configured.

Unless otherwise defined, the terms (including technical and scientific terms) used herein have the same meaning as commonly understood by one of ordinary skill in the art to which example embodiments belong. It should be further understood that terms, such as those defined in commonly used dictionaries, should be interpreted as having a meaning that is, for example, consistent with their meaning in the context of the relevant art and should not be interpreted in an idealized or overly formal sense, unless expressly defined otherwise herein.

In the following description, various example embodiments of the present disclosure are described in detail with reference to the accompanying drawings. With respect to reference numerals to elements of each of the drawings, the same elements can be illustrated in other drawings, and like reference numerals can refer to like elements unless stated otherwise. In addition, for convenience of description, a scale, dimension, size, and thickness of each of the elements illustrated in the accompanying drawings can be different from an actual scale, dimension, size, and thickness. Thus, embodiments of the present disclosure are not limited to a scale, dimension, size, or thickness illustrated in the drawings.

A stretchable display apparatus can be referred to as a display apparatus which is capable of displaying images even though the display apparatus is bent or extended. The stretchable display apparatus can have a high flexibility as compared with a general display.

Therefore, a shape of a stretchable display apparatus can be freely changed in accordance with manipulation of a user to bend or stretch a stretchable display apparatus. For example, when the user holds ends of the stretchable display apparatus to pull the stretchable display apparatus, the stretchable display apparatus can be stretched by the force of the user. Alternatively, when the user disposes the stretchable display apparatus on a wall surface which is not flat, the stretchable display apparatus can be disposed to be bent in accordance with the shape of the surface of the wall. Further, when a force applied by the user is removed, the stretchable display apparatus can return to its original shape.

FIG. 1 is an exploded perspective view of a display apparatus according to an embodiment of the present disclosure.

Referring to FIG. 1, a stretchable display apparatus 100 can include a lower substrate 110, a plurality of second substrates 111, a plurality of connection substrates CS, a chip on film (COF) 170, a printed circuit board 180, an upper substrate 160, and a polarization layer 165. The display apparatus 100 can be a stretchable display apparatus and hereinafter, the stretchable display apparatus will be described as an example.

For example, the stretchable display apparatus is freely transformed to any shape such as stretching, folding, and twisting, so that is a free-form display apparatus.

For example, the stretchable display apparatus is thin and lightness, and can be attachable onto a curved surface, such as skins or clothes. Therefore, the stretchable display apparatus can be applied to various industrial fields, such as wearable, mobility, smart devices, gaming, and fashions. Further, it can be a display apparatus which can change daily life because it can enable an era of IT devices worn like clothes or attached to the body.

The lower substrate 110 is a substrate which supports and protects various components of the display apparatus 100 and can be a first substrate. The lower substrate 110 which is a flexible substrate can be configured by an insulating material which is bendable or stretchable. For example, the lower substrate 110 can be formed of a silicon rubber such as a polydimethylsiloxiane (PDMS) or an elastomer such as a polyurethane (PU) or a polytetrafluoroethylene (PTFE), and thus have a flexible property. However, the material of the lower substrate 110 is not limited thereto.

The lower substrate 110 is a flexible substrate so as to be reversibly expanded and/or contracted. Further, an elastic modulus (or a modulus of elasticity) can be several MPa to several hundreds of MPa and a stretching fracture ratio can be 100% or higher. For example, a thickness of the lower substrate 110 can be 10 μm to 1 mm, but is not limited thereto.

The lower substrate 110 can have a display area (or an active area) AA and a non-display area (or a non-active area) NA enclosing the display area AA.

The display area AA is an area in which an image is displayed in the display apparatus 100 and a display element and various driving elements for driving the display element can be disposed in the display area AA. The display area AA can include a plurality of pixels including a plurality of sub pixels. The plurality of pixels are disposed in the display area AA and can include a plurality of display elements. The plurality of sub pixels can be connected to various wiring lines, respectively. For example, each of the plurality of sub pixels can be connected to various wiring lines, such as a gate line, a data line, a high potential power line, a low potential power line, and a reference voltage line.

The non-display area NA can be an area adjacent to the display area AA. The non-display area NA is adjacent to the display area AA to enclose the display area AA. In the non-display area NA, no image is displayed and wiring lines and circuit parts can be formed. For example, in the non-display area NA, a plurality of pads can be disposed and the pads can be connected to the plurality of sub pixels of the display areas AA, respectively.

The plurality of second substrates 111 can be disposed on the lower substrate 110. The plurality of second substrates 111 is rigid substrates and can be independently disposed on the lower substrate 110 to be spaced apart from each other. The plurality of second substrates 111 can have a rigidity more than the lower substrate 110. For example, the lower substrate 110 can have a flexibility more than the plurality of second substrates 111 and the plurality of second substrates 111 can have a rigidity more than the lower substrate 110.

For example, the plurality of second substrates 111 can be formed of a plastic material having flexibility. For example, the plurality of second substrates 111 can be formed of a polyimide (PI), a polyacrylate, and a polyacetate or the like.

A modulus of the plurality of second substrates 111 can be higher than a modulus of the lower substrate 110. The modulus can be an elastic modulus which represents a ratio being deformed by a stress with respect to a stress applied to the substrate. For example, the higher the modulus, the higher the hardness. Therefore, the plurality of second substrates 111 can be a plurality of rigid substrates which has a rigidity larger than that of the lower substrate 110. The moduli of the plurality of second substrates 111 can be 1,000 times higher than the modulus of the lower substrate 110, but is not limited thereto.

In some exemplary embodiments, the lower substrate 110 can include a plurality of first lower patterns and a second lower pattern. The plurality of first lower patterns can be disposed in an area of the lower substrate 110 overlapping the plurality of second substrates 111, and the second lower pattern can be disposed in an entire area excluding the area in which the plurality of second substrates 111 is disposed or in the entire area of the display apparatus 100.

The moduli of the plurality of first lower patterns can be higher than modulus of the second lower pattern. For example, the plurality of first lower patterns can be formed of the same material as the plurality of second substrates 111 and the second lower pattern can be formed of a material having a modulus lower than that of the plurality of second substrates 111.

The plurality of connection substrates CS can be disposed between the plurality of second substrates 111. The plurality of connection substrates CS are substrates which connect the second substrates 111 which are adjacent to each other and can be third substrates. The plurality of connection substrates CS can be simultaneously and integrally formed with the same material as the second substrate 111, but is not limited thereto.

The plurality of connection substrates CS can have a wavy shape or a curved shape. For example, as illustrated in FIG. 1, the plurality of connection substrates CS can have a sine wave shape. However, the shape of the plurality of connection substrates is not limited thereto, and the plurality of connection substrates CS can extend with a zigzag pattern or can be formed with various shapes such as a shape extended by connecting a plurality of rhombus-shaped substrates at vertexes. Further, the number and the shape of the plurality of connection substrates CS illustrated in FIG. 1 are illustrative and the number and the shape of the plurality of connection substrates CS can vary based on the design, and are not limited thereto.

The COF 170 is a film on which various components can be disposed on a base film 171 having a flexibility, and can be a component supplying signals to the plurality of sub pixels of the display area AA. The COF 170 can be bonded or connected to the plurality of pads disposed in the non-display area NA and can supply a power voltage, a data voltage, and a gate voltage or the like to each of the plurality of sub pixels of the display area AA through the pads. The COF 170 can include the base film 171 and a driving integrated circuit (IC) 172. Further, various components can be further disposed thereon.

The base film 171 can be a layer which supports the driving IC 172 of the COF 170. The base film 171 can be formed of an insulating material, and for example, can be formed of an insulating material having a flexibility.

The driving IC 172 can be a component which processes a data for displaying images and a driving signal for processing the data. In FIG. 1, even though it is illustrated that the driving IC 172 is mounted by the COF 170 technique, it is not limited thereto, and the driving IC 172 can be mounted by chip on glass (COG) or tape carrier package (TCP).

A control part such as an IC chip and a circuit part or the like can be mounted on the printed circuit board 180. Further, on the printed circuit board 180, a memory and a processor or the like can also be mounted. For example, the printed circuit board 180 can be a configuration which transmits a signal for driving the display element from the control part to the display element.

The printed circuit board 180 can be connected to the COF 170 to be electrically connected to each of the plurality of sub pixels of the plurality of second substrates 111.

For example, the upper substrate 160 can overlap the lower substrate 110 to protect various components of the display apparatus 100. The upper substrate 160 which is a flexible substrate can be configured by an insulating material which is bendable or stretchable. For example, the upper substrate 160 can be formed of a flexible material and formed of the same material as the lower substrate 110, but is not limited thereto. For example, the upper substrate 160 can be configured by a silicon rubber such as polydimethylsiloxane, a polyurethane, or a polytetrafluoroethylene. For example, the upper substrate 160 can be a third substrate, but the exemplary embodiments of the present disclosure are not limited thereto.

The polarization layer 165 can be a configuration which suppresses or prevents external light reflection of the display apparatus 100, and can overlap the upper substrate 160 to be disposed above the upper substrate 160. However, the polarization layer 165 is not limited thereto, and can be disposed below the upper substrate 160 or omitted based on the configuration of the display apparatus 100.

Figure 2:
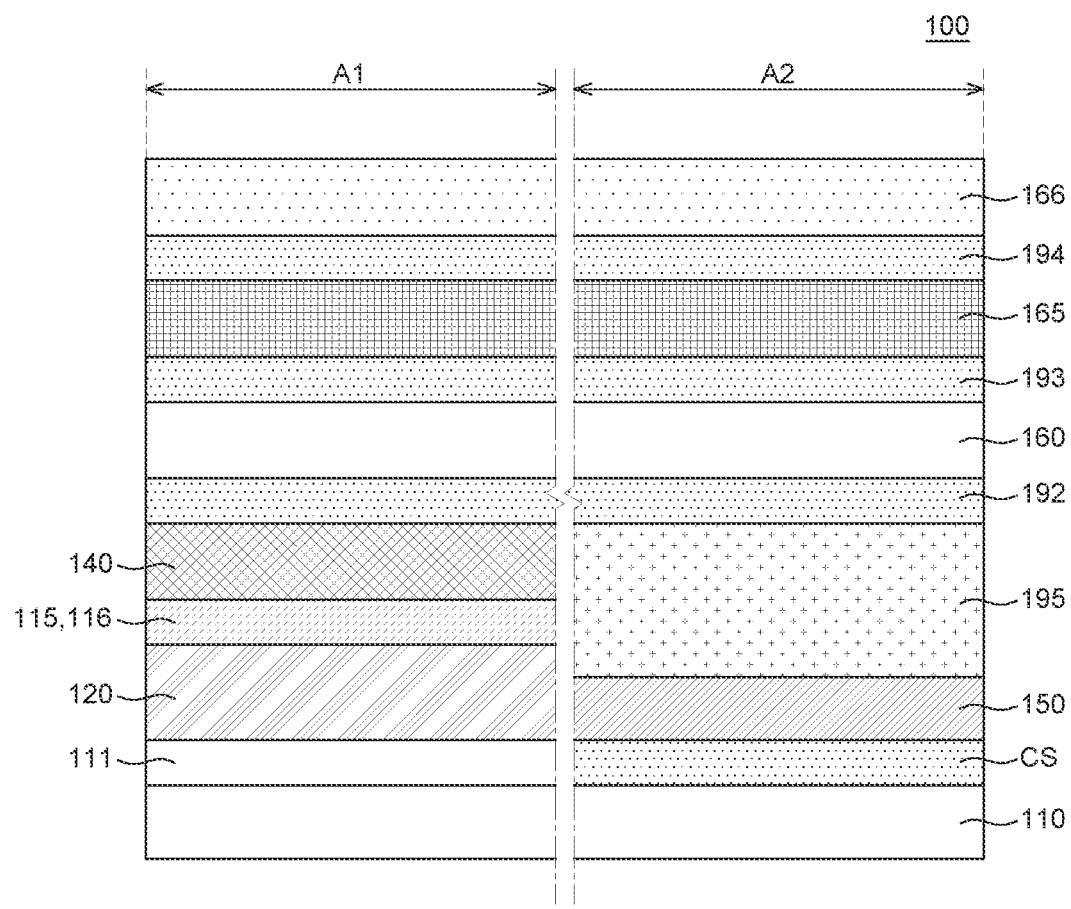
FIG. 2 illustrates a structure of a display apparatus according to an exemplary embodiment of the present disclosure.

FIG. 2 illustrates a structure of a display apparatus according to a first exemplary embodiment of the present disclosure, and illustrates a structure of a display area of the display apparatus 100 according to the exemplary embodiment of the present disclosure.

Referring to FIG. 2, the display apparatus 100 of the exemplary embodiment of the present disclosure can include a display area which is divided into or includes a plurality of first areas A1 in which the plurality of second substrates 111 is disposed and a plurality of second area A2 in which a plurality of connection lines 150 is disposed. However, the present disclosure is not limited thereto. For example, in the second area A2, a connection pattern layer may be provided, and the connection lines 150 may be formed in the connection pattern layer by patterning the connection pattern layer.

The plurality of first areas A1 can be areas in which the plurality of second substrates 111 can be disposed and can have a rigidity. For example, the plurality of first areas A1 can be spaced apart from each other to be configured on the lower substrate 110.

For example, the plurality of pixels including a plurality of sub pixels can be configured in the plurality of second substrates 111 of the plurality of first areas A1. In each of the plurality of sub pixels, a plurality of light emitting diodes 140 and various driving elements 120 for driving the plurality of light emitting diodes 140 can be disposed and each of the plurality of sub pixels can be connected to various wiring lines. However, the present disclosure is not limited thereto. For example, a light emitting layer including a plurality of light emitting portions may be formed on the plurality of second substrates 111. For example, the driving element 120 can be disposed above the second substrate 111 and the light emitting diode 140 can be disposed above the driving element 120 with first and second planarization layers 115 and 116 interposed therebetween. In this case, an upper surface of the light emitting layer 142 and an upper of the first adhesive member 195 may have the same height, i.e., located on the same plane.

The plurality of second areas A2 can be provided to be adjacent to the plurality of first areas A1. For example, the plurality of second areas A2 can be disposed between two first areas A1 which are adjacent to each other.

The plurality of second areas A2 can be areas in which the plurality of connection lines 150 and the plurality of connection substrates CS are disposed and can have a flexibility. The plurality of second areas A2 can be spaced apart from each other to be disposed above the lower substrate 110.

For example, the plurality of connection lines 150 and the plurality of connection substrates CS can be disposed in the plurality of second areas A2. For example, the connection line 150 can be disposed above the connection substrate CS and the connection line 150 can be electrically connected to pads above the second substrate 111. Embodiment of the present disclosure are not limited thereto, and the connection substrate CS can be omitted or replaced with the second substrate 111. For example, when the connection substrate CS is omitted, the connection line 150 may be directly disposed on the second area A2. In this case, an upper surface of the light emitting layer 142 and an upper of the connection pattern layer (or connection line 150) may have the same height, i.e., located on the same plane. However, the present disclosure is not limited thereto.

According to an exemplary embodiment of the present disclosure, in the plurality of second areas A2, a first adhesive member 195 including elastic hollow particles can be disposed above the connection line 150. The second adhesive member 192 can be disposed on the light emitting diode 140.

The first adhesive member 195 can include an adhesive having a relatively low elastic modulus. For example, the first adhesive member 195 can include an adhesive resin. For example, the first adhesive member 195 can include an optically cleared resin (OCR). For example, the first adhesive member 195 can include an adhesive having a lower elastic modulus than that of the second adhesive member 192. For example, the elastic modulus can be a strain caused by the shear stress. For example, the shear stress can be a stress which acts in a direction parallel to an arbitrary plane. For example, the elastic modulus can be a modulus of rigidity or a shear modulus.

The second adhesive member 192 can include an adhesive having a relatively high elastic modulus. For example, the second adhesive member 192 can include an optically cleared adhesive (OCA). For example, the second adhesive member 192 can include an adhesive having a high elastic modulus of approximately $5 \times 10^4$ Pa or more to $10^7$ Pa or less. For example, the elastic modulus can be a shear modulus. For example, the second adhesive member 192 can be disposed above the substrate 110 in the entire first area A1 and second area A2 like a tape. For example, the second adhesive member 192 can be commonly disposed above the light emitting diode 140 of the first area A1 and above the first adhesive member 195 of the second area A2, but is not limited thereto.

For example, the second adhesive member 192 can be configured by a material having a higher shear modulus than that of the first adhesive member 195 so that the second adhesive member 192 having a low shear modulus can be fixed.

According to an exemplary embodiment of the present disclosure, the first adhesive member 195 adjacent to the connection line 150 can be disposed on the connection line 150 so that the resilience for the deformation of the display apparatus 100 can be improved.

For example, the first adhesive member 195 can be coated or formed above the connection line 150 by the inkjet method. The inkjet method enables the selective coating in the second area A2 and large-area printing to optimize the process.

According to an exemplary embodiment of the present disclosure, the first adhesive member 195 including elastic hollow particles having a high resilience is selectively formed above the connection line 150 of the second area A2 of the display apparatus 100. Therefore, when the display apparatus 100 or the stretchable display apparatus is deformed, the resilience is improved together with the second adhesive member 192 above the first adhesive member 195 to minimize the deformation to improve the reliability.

Further, the first adhesive member 195 uses an inkjet method to be selectively formed in a desired area, for example, in the second area A2 in which the deformation is concentrated. Further, the deformation, such as compression of the second area A2 which is deformed during the stretching can be restored without affecting the first area A1 having the rigidity. Thus, the display apparatus 100 according to an exemplary embodiment of the present disclosure can be a Z-axis (or other designated axis) stretched display apparatus. For example, the display apparatus 100 according to an exemplary embodiment of the present disclosure can provide a display apparatus 100 in which at least two corner portions are stretchable. For example, the display apparatus 100 in which four corner portions of the display apparatus 100 are stretchable can be provided.

According to an exemplary embodiment of the present disclosure, the second adhesive member 192 having a high shear modulus can be configured above the first adhesive member 195 on the connection line 150 so that the Z-axis deformation by the flexibility of the first adhesive member 195 having a low shear modulus can be improved. According to an exemplary embodiment of the present disclosure, the first adhesive member 195 includes hollow particles so that the compression caused during the stretching can be improved by the enhancement of the resilience. According to an exemplary embodiment of the present disclosure, the adhesive member 195 can be formed on the connection line 150 by the inkjet method to be selectively formed on the connection line 150.

The upper substrate 160 can be disposed above the lower substrate 110 in which the second adhesive member 192 is disposed.

The upper substrate 160 can be a substrate which supports various components disposed below the upper substrate 160. The upper substrate 160 which is a flexible substrate can be configured by an insulating material which is bendable or stretchable. The upper substrate 160 can be a flexible substrate so as to be reversibly expanded and/or contracted.

The upper substrate 160 can be formed of the same material as the lower substrate 110 and for example, can be formed of a silicon rubber such as polydimethylsiloxane (PDMS), or an elastomer such as polyurethane (PU). Therefore, the upper substrate 120 can have a flexible property. When the upper substrate 160 is configured by the silicon material, the upper substrate can be implemented by a substrate with a film material having excellent flexibility. However, the material of the upper substrate 160 may not be limited thereto.

The polarization layer 165 can be disposed above the upper substrate 160 with the third adhesive member 193 interposed therebetween.

The polarization layer 165 can polarize light incident from the outside of the display apparatus 100. The polarized light which passes through the polarization layer 165 to be incident into the display apparatus 100 can be reflected in the display apparatus 100, and thus, a phase can be shifted. Light with the shifted phase may not pass through the polarization layer 165 and light which is incident into the display apparatus 100 from the outside of the display apparatus 100 is not emitted to the outside of the display apparatus 100, and thus, the external light reflection of the display apparatus 100 can be reduced.

A cover member 166 can be disposed above the polarization layer 165. For example, the cover member 166 can be a cover window or a window cover, but is not limited by the term.

A fourth adhesive member 194 can be disposed between the polarization layer 165 and the cover member 166.

Hereinafter, a display apparatus 100 according to an exemplary embodiment of the present disclosure will be described in more detail with reference to FIGS. 3 and 4.

Figure 3:
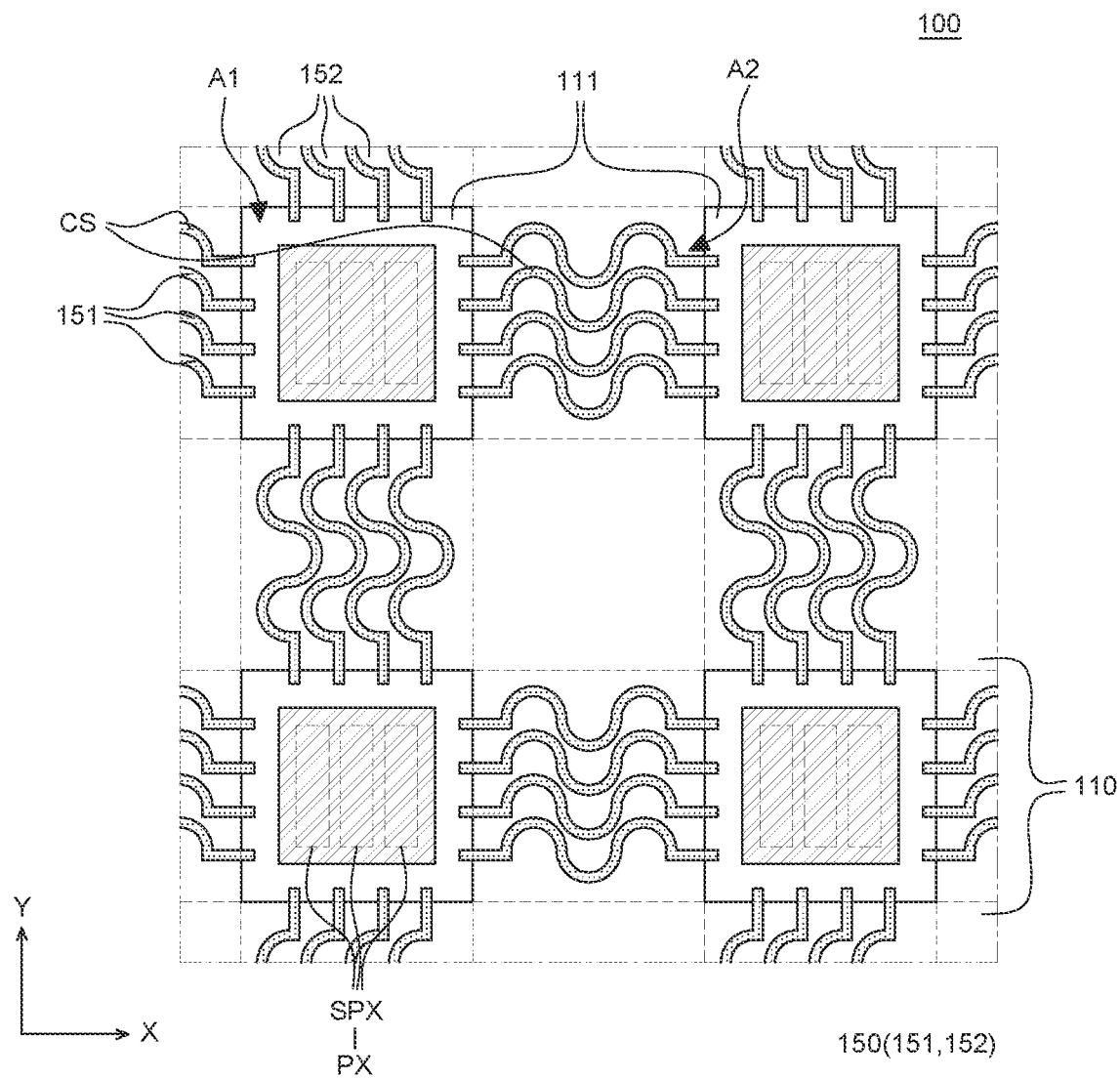
FIG. 3 is an enlarged plan view of a display apparatus according to an exemplary embodiment of the present disclosure.

Particularly, FIG. 3 is an enlarged plan view of a display apparatus according to an exemplary embodiment of the present disclosure.

Figure 4:
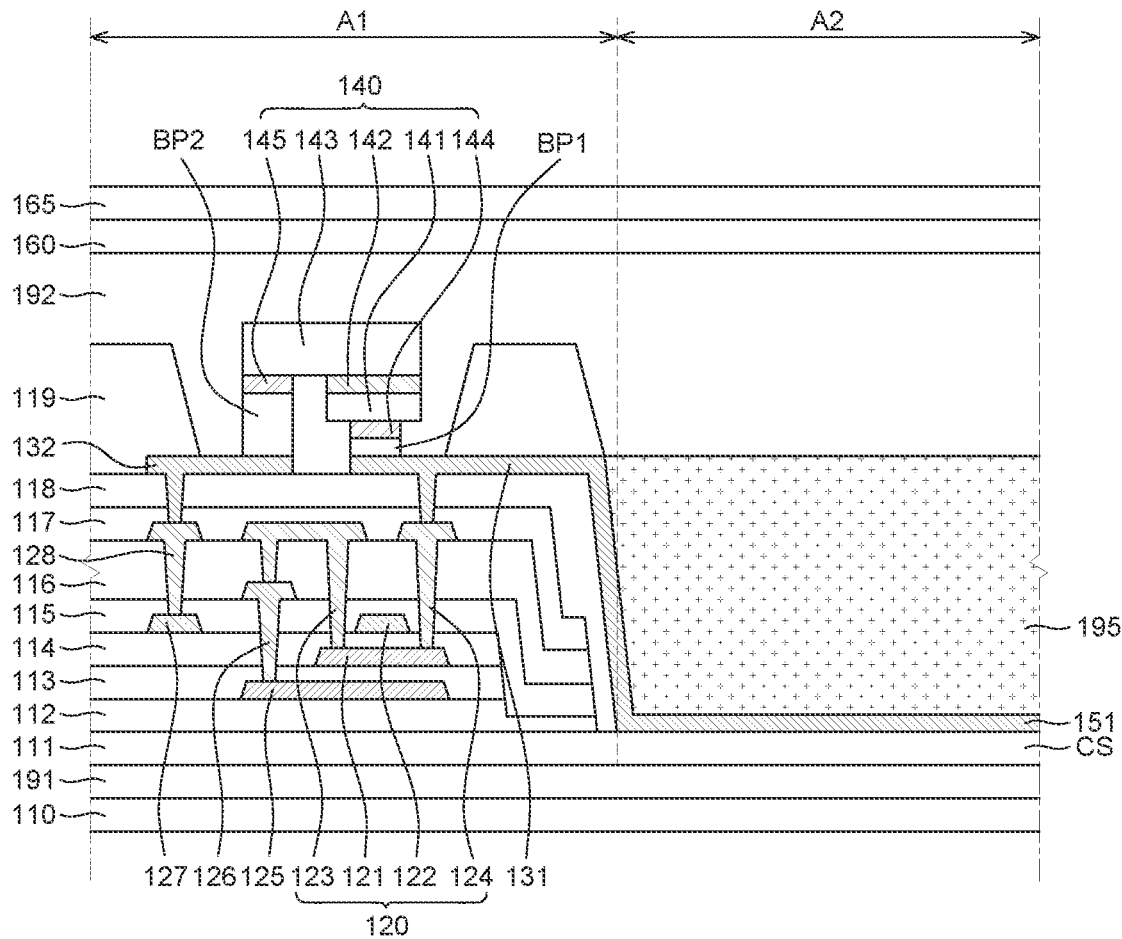
FIG. 4 is a cross-sectional view of one sub pixel of FIG. 1 according to an exemplary embodiment of the present disclosure.

FIG. 4 is a cross-sectional view of one sub pixel of FIG. 1 according to an exemplary embodiment of the present disclosure, and illustrates a part of a cross-section of one sub pixel SPX including a first area A1 and a second area A2.

For the convenience of description, the description will be made with reference to FIGS. 1 to 2 together.

Referring to FIGS. 3 and 4, the lower substrate 110 can include a plurality of first areas A1 in which the plurality of second substrates 111 are disposed and a plurality of second areas A2 in which a plurality of connection lines 150 are disposed.

For example, the plurality of first areas A1 of the lower substrate 110 can be areas in which the plurality of second substrates 111 is disposed, and can have a rigidity. The plurality of first areas A1 can be spaced apart from each other to be disposed above the lower substrate 110. For example, as illustrated in FIGS. 1 and 3, the plurality of first areas A1 can be disposed on the lower substrate 110 in a matrix form, but is not limited thereto.

The plurality of pixels PX including a plurality of sub pixels SPX can include the plurality of second substrates 111 of the plurality of first areas A1. In each of the plurality of sub pixels SPX, a plurality of light emitting diodes 140 and various driving elements for driving the plurality of light emitting diodes 140 can be disposed, and each of the plurality of sub pixels SPX can be connected to various wiring lines. For example, each of the plurality of sub pixels SPX can be connected to various wiring lines, such as a gate line, a data line, a high potential power source line, a low potential power source line, a reference voltage line, and a common line 127 or the like.

For example, the lower substrate 110 can include the plurality of second areas A2 to be adjacent to the plurality of first areas A1. The plurality of second areas A2 can be disposed between two first areas A1 which are adjacent to each other. Therefore, as illustrated in FIG. 3, a plurality of second areas A2 can be provided at the top (or the upper), the bottom (or the lower), the left, and the right sides of one first area A1.

For example, the plurality of second areas A2 can be areas in which the plurality of connection lines 150 and the plurality of connection substrates CS are disposed, and can have a flexibility. The plurality of second areas A2 can be spaced apart from each other to be disposed on the lower substrate 110. For example, as illustrated in FIGS. 1 and 3, the plurality of second areas A2 can be disposed above the lower substrate 110 in a matrix form, but is not limited thereto.

For example, the plurality of connection lines 150 and the plurality of connection substrates CS can be disposed in the plurality of second areas A2 of the lower substrate 110. The plurality of connection lines 150 can be disposed on the plurality of connection substrates CS.

In the case of a display apparatus of the related art, various wiring lines such as a plurality of gate lines and a plurality of data lines extend between the plurality of sub pixels and a plurality of sub pixels can be connected to one signal line. Accordingly, in the display apparatus of the related art, various wiring lines such as a gate line, a data line, a high potential power source line, and a reference voltage line can extend from one side to the other side of the display apparatus without being disconnected on the substrate.

In the display apparatus 100 according to an exemplary embodiment of the present disclosure, various wiring lines formed of a metal material, such as the gate line, the data line, the high potential power line, the low potential power line, the reference voltage line, and the common line 127 or the like can be disposed only above the plurality of second substrates 111. In the display apparatus 100 according to an exemplary embodiment of the present disclosure, various wiring lines formed of a metal material can be disposed only on the plurality of second substrates 111, but can be disposed so as not to be in contact with (or not adjoin) the lower substrate 110. Therefore, various wiring lines which are formed of a metal material can be patterned so as to correspond to the plurality of second substrates 111 to be discontinuously disposed.

In the display apparatus 100 according to an exemplary embodiment of the present disclosure, to connect discontinuous lines on the plurality of substrates 111, a plurality of connection lines 150 can be disposed between two second substrates 111 which are adjacent to each other. For example, the plurality of connection lines 150 can be connected to pads on two second substrates 111 which are adjacent to each other. Various wiring lines, such as the gate line, the data line, the high potential power line, the low potential power line, the reference voltage line, and the common line 127 or the like, on two second substrates 111 which are adjacent to each other can be electrically connected by the plurality of connection lines 150.

For example, the gate line can be disposed on the plurality of second substrates 111 disposed to be adjacent to each other in the X-axis direction and a gate pad can be disposed on both ends (or one side) of the gate line. Each of the plurality of gate pads above the plurality of second substrates 111 disposed adjacent to each other in the X-axis direction can be connected to each other by the plurality of connection lines 150 which serves as gate lines. Therefore, the gate line disposed above the plurality of second substrates 111 of the first area A1 and the plurality of connection lines 150 disposed in the second area A2 can serve as one gate line.

Further, all various wiring lines which can be included in the display apparatus 100, such as the data line, the high potential power line, the low potential power line, the reference voltage line, and the common line 127 or the like can serve as one wiring line by the plurality of connection lines 150.

The plurality of connection lines 150 can be disposed on the plurality of connection substrates CS. The plurality of connection substrates CS can have a wavy shape. Accordingly, the plurality of connection lines 150 disposed on the plurality of connection substrates CS can have a wavy shape or a curved shape like the plurality of connection substrates CS.

For example, the plurality of connection lines 150 can be formed of a conductive material. The plurality of connection lines 150 can be formed of the same material as various conductive components disposed on the plurality of second substrates 111 and for example, can be formed of a metal material, but is not limited thereto, and can also include a base polymer and conductive particles dispersed in the base polymer.

The plurality of connection lines 150 can include a plurality of first connection lines 151 and a plurality of second connection lines 152.

The plurality of first connection lines 151 can be wiring lines extending in the X-axis direction, among the plurality of connection lines 150. The plurality of first connection lines 151 can connect pads above two second substrates 111 which are adjacent to each other, among the plurality of second substrates 111 which are disposed to be adjacent in the X-axis direction. The plurality of first connection lines 151 can serve as a gate line or a low potential power line, but is not limited thereto. For example, when the plurality of first connection lines 151 serves as a gate line, the gate pads above two second substrates 111 which are disposed side by side in the X-axis direction can be electrically connected.

The plurality of second connection lines 152 can be wiring lines extending in the Y-axis direction, among the plurality of connection lines 150. The plurality of second connection lines 152 can connect pads each other on two second substrates 111 which are adjacent to each other, among the plurality of second substrates 111 which are disposed to be adjacent in the Y-axis direction. The plurality of second connection lines 152 can serve as a data line or a high potential power line, but is not limited thereto. For example, when the plurality of second connection lines 152 serves as a data line, data pads on two second substrates 111 which are disposed side by side in the Y-axis direction can be electrically connected.

A fifth adhesive member 191 can be disposed between the lower substrate 110 and the second substrate 111, but can be omitted according to the configuration of the display apparatus 100.

The fifth adhesive member 191 can include an adhesive. For example, the fifth adhesive member 191 can include an optically cleared adhesive (OCA), but is not limited thereto. For example, the fifth adhesive member 191 can include an adhesive having a higher shear modulus than that of the first adhesive member 195. For example, the fifth adhesive member 191 can include an adhesive having a high shear modulus of approximately $5 \times 10^4$ Pa or more to $10^7$ Pa or less. For example, the fifth adhesive member 191 can be disposed above the lower substrate 110 including the first area A1 and the second area A2 like a tape method. For example, the fifth adhesive member 191 can be disposed above the entire lower substrate 110 including the first area A1 and the second area A2. For example, the fifth adhesive member 191 can include an adhesive having the same shear modulus as the second adhesive member 192.

According to an exemplary embodiment of the present disclosure, the first adhesive member 195 can be disposed between the second adhesive member 192 and the fifth adhesive member 191. For example, the second adhesive member 192 and the fifth adhesive member 191 can be configured by an adhesive having a higher shear modulus than that of the first adhesive member 195. For example, the first adhesive member 195 can be configured by an adhesive having a lower shear modulus than that of the second adhesive member 192 and/or the fifth adhesive member 191. Therefore, the first adhesive member 195 having a lower shear modulus can be fixed by the second adhesive member 192 and/or the fifth adhesive member 191 having a higher shear modulus than that of the first adhesive member 195. The first adhesive member 195 can be configured by an inkjet method to be selectively formed on the connection line 150 to have an advantage of easiness of process. The first adhesive member 195 formed on the connection line 150 can be formed without affecting the light emitting diode 140.

A buffer layer 112 can be disposed on the plurality of second substrates 111.

The buffer layer 112 can be disposed on the plurality of second substrates 111 to protect various components of the display apparatus 100 from permeation of moisture and oxygen from the outside of the lower substrate 110 and the second substrate 111. The buffer layer 112 can be configured by an insulating material, and for example, configured by a single layer or a plurality of layers of an inorganic layer formed of silicon nitride (SiNx), silicon oxide (SiOx), and silicon oxynitride (SiON). However, the buffer layer 112 can be omitted based on a structure or a characteristic of the display apparatus 100.

The buffer layer 112 can be disposed only in an area overlapping the plurality of second substrates 111. As described above, the buffer layer 112 can be formed of an inorganic layer so that the buffer layer 141 can be easily cracked or damaged during a process of stretching the display apparatus 100. Therefore, the buffer layer 112 may not be disposed in the second area A2 between the plurality of second substrates 111, but is patterned to have the shape of the plurality of second substrates 111 to be disposed only above the plurality of second substrates 111. As described above, in the display apparatus 100 according to an exemplary embodiment of the present disclosure, the buffer layer 112 can be disposed only in an area overlapping the plurality of second substrates 111 which is rigid substrates. Therefore, even though the display apparatus 100 is bent or stretched so that the display apparatus 100 is deformed, the damage of the buffer layer 112 can be suppressed or prevented.

A transistor 120 which includes a gate electrode 122, an active layer 121, a source electrode 123, and a drain electrode 124 can be disposed on the buffer layer 112.

First, a light shielding layer 125 can be disposed on the buffer layer 112.

The light shielding layer 125 can be disposed below the transistor 120 to block or shield the active layer 121.

The light shielding layer 125 can be configured by an opaque metal material, for example, by at least one of conductive metals including aluminum (Al), tungsten (W), copper (Cu), molybdenum (Mo), chrome (Cr), titanium (Ti), moly tungsten (MoW), molytitanium (MoTi), and copper/molytitanium (Cu/MoTi). However, the metal may not be limited thereto, and any metal material which can block the light is available.

A first insulating layer 113 can be disposed on the light shielding layer 125.

The first insulating layer 113 can be referred to as another buffer layer.

For example, the first insulating layer 113 can be configured by silicon oxide (SiOx), silicon nitride (SiNx), or a plurality of layers thereof, but is not limited thereto.

The active layer 121 can be disposed on the first insulating layer 113.

For example, the active layer 121 can be configured by an oxide semiconductor or amorphous silicon (a-Si), polycrystalline silicon (poly-Si), or an organic semiconductor, but is not limited thereto.

A second insulating layer 114 can be disposed on the active layer 121. For example, the second insulating layer 114 is a layer which is to electrically insulate the gate electrode 122 and the active layer 121, and can be a gate insulating layer.

For example, the second insulating layer 114 can be configured by silicon oxide (SiOx), silicon nitride (SiNx), or a plurality of layers thereof, but is not limited thereto.

The gate electrode 122 can be disposed on the second insulating layer 114.

The gate electrode 122 can be disposed so as to overlap the active layer 121. The gate electrode 122 can be formed of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a plurality of layers thereof, but it is not limited thereto.

The common line 127 can be disposed on the same layer as the gate electrode 122. The common line 127 can be a wiring line which applies a common voltage to the plurality of sub pixels SPX. However, it is not limited thereto, and the common line 127 can be disposed on the same layer as the source electrode 123 and the drain electrode 124.

The gate pad can be disposed on the same layer as the gate electrode 122. The gate pad can be a pad which transmits a gate signal to the plurality of sub pixels SPX. The gate pad can be formed of the same material as the gate electrode 122, but is not limited thereto.

The gate pad can transmit a gate signal from the connection line 150 which serves as the gate line to the plurality of sub pixels SPX. For example, the gate pad can be connected to the connection line 150, and can transmit a gate signal to the plurality of sub pixels SPX.

A third insulating layer 115 can be disposed on the gate electrode 122.

For example, the third insulating layer 115 can be a layer which insulates the gate electrode 122 from the source electrode 123 and the drain electrode 124, and the third insulating layer 115 can be a first interlayer insulating layer. For example, the third insulating layer 115 can be configured by silicon oxide (SiOx), silicon nitride (SiNx), or a plurality of layers thereof, but is not limited thereto.

The first connection electrode 126 can be disposed on the third insulating layer 115, and can be omitted according to the configuration of the display apparatus 100.

The first connection electrode 126 can electrically connect to the light shielding layer 125 therebelow through a contact hole.

A fourth insulating layer 116 can be disposed on the first connection electrode 126.

For example, the fourth insulating layer 116 can be a layer which insulates between the gate electrode 122, the source electrode 123 and the drain electrode 124, and the fourth insulating layer 116 can be a second interlayer insulating layer. For example, the fourth insulating layer 116 can be configured by silicon oxide (SiOx), silicon nitride (SiNx), or a plurality of layers thereof, but exemplary embodiments of the present disclosure are not limited thereto.

The source electrode 123 and the drain electrode 124 which are connected to the source region and the drain region, respectively, of the active layer 121 can be disposed on the fourth insulating layer 116. The source electrode 123 and the drain electrode 124 can be disposed on the same layer to be spaced apart from each other. The source electrode 123 and the drain electrode 124 can be configured by any one of various metal materials such as molybdenum (Mo), aluminum (Al), chrome (Cr), gold (Au), titanium (Ti), nickel (Ni), neodymium (Nd), and copper (Cu) or an alloy of two or more of them, or a plurality of layers thereof, but it is not limited thereto.

For example, the source electrode 123 can be electrically connected to the light shielding layer 125 through the first connection electrode 126. Even though in FIG. 4, it is illustrated that the light shielding layer 125 can be electrically connected to the source electrode 123 of the transistor, it is not limited thereto, and the light shielding layer 125 can be electrically connected to the drain electrode 124.

The first insulating layer 113, the second insulating layer 114, the third insulating layer 115, and the fourth insulating layer 116 are patterned to be disposed only in an area overlapping the plurality of second substrates 111. For example, the first insulating layer 113, the second insulating layer 114, the third insulating layer 115, and the fourth insulating layer 116 can be formed of the inorganic material, which is the same as the buffer layer 112. Therefore, the first insulating layer 113, the second insulating layer 114, the third insulating layer 115, and the fourth insulating layer 116 can be easily cracked during the process of stretching the display apparatus 100, as described above. Therefore, the first insulating layer 113, the second insulating layer 114, the third insulating layer 115, and the fourth insulating layer 116 may not be disposed between the plurality of second substrates 111, and can be patterned to have shapes of the plurality of second substrates 111 to be disposed only above the plurality of second substrates 111.

In FIG. 4, even though among various transistors which can be included in the display apparatus 100, only a driving transistor is illustrated for the convenience of description, a switching transistor or a capacitor can also be included in the display apparatus 100. Further, in this disclosure, even though it is illustrated that the driving transistor 120 has a coplanar structure, various transistors such as a staggered structure can also be applied.

The second connection electrode 128 can be disposed on the fourth insulating layer 116, and can be omitted according to the configuration of the display apparatus 100.

The second connection electrode 128 can be electrically connected to the lower common line 127 through a contact hole.

The fifth insulating layer 117 and the sixth insulating layer 118 can be disposed on the source electrode 123, the drain electrode 124, and the second connection electrode 128. For example, the fifth insulating layer 117 and the sixth insulating layer 118 can be a first planarization layer and a second planarization layer, respectively. The fifth insulating layer 117 and the sixth insulating layer 118 can planarize an upper portion of the plurality of second substrates 111 including the transistor, or planarize a lower portion of the light emitting diode 140. For example, the fifth insulating layer 117 and the sixth insulating layer 118 can be formed of an organic material. For example, the fifth insulating layer 117 and the sixth insulating layer 118 can be formed of an acrylic organic material, but is not limited thereto. For example, the fifth insulating layer 117 and the sixth insulating layer 118 can include a contact hole through which the transistor 120 and the light emitting diode 140 are electrically connected, a contact hole through which the pad and the connection pad are electrically connected, and a contact hole through which the common line 127 and the light emitting diode 140 are electrically connected.

In some exemplary embodiments, a passivation layer can be disposed between the transistor 120 and the fifth insulating layer 117. For example, the passivation layer can be formed to cover the transistor 120 to protect the transistor 120 from the permeation of the moisture and oxygen. The passivation layer can be formed of an inorganic material and configured by a single layer or a plurality of layers, but is not limited thereto.

For example, the fifth insulating layer 117 and the sixth insulating layer 118 can be patterned to be disposed only in an area overlapping the plurality of second substrates 111. Therefore, the fifth insulating layer 117 and the sixth insulating layer 118 may not be disposed in an area between the plurality of second substrates 111, but can be patterned to have a shape of the plurality of second substrates 111 to be disposed only above the plurality of second substrates 111, but are not limited thereto.

A first pad 131 and a second pad 132 can be disposed on the sixth insulating layer 118.

For example, the first pad 131 can be an electrode which electrically connects the transistor 120 and the light emitting diode 140. For example, the first pad 131 can be disposed above the sixth insulating layer 118 to be in contact with the light emitting diode 140, and the first pad 131 can be in contact with the drain electrode 124 of the transistor 120 through the contact hole formed in the sixth insulating layer 118. Accordingly, the light emitting diode 140 and the transistor 120 can be electrically connected by the first pad 131. Based on the type of the transistor 120, the first pad 131 can be connected to the source electrode 123 of the transistor 120, but is not limited thereto.

The second pad 132 can be an electrode which electrically connects the light emitting diode 140 and the common line 127. The second pad 132 can be disposed above the sixth insulating layer 118 to be in contact with the light emitting diode 140, and the second pad 132 can be in contact with the second connection electrode 128 through the contact hole formed in the sixth insulating layer 118. Therefore, the light emitting diode 140 and the common line 127 can be electrically connected by the second pad 132 and the second connection electrode 128.

In the plurality of second areas A2, the connection line 150 can be disposed on the connection substrate CS. For example, the connection line 150 can be connected to the first pad 131. Further, the connection line 150 can be connected to the data pad through the contact hole. Accordingly, the connection line 150 can be electrically connected to the data pad to transmit a data signal to the data pad. Further, the connection line 150 can be connected to the gate pad through the contact hole. Accordingly, the connection line 150 can be electrically connected to the gate pad to transmit a gate signal to the gate pad.

The first adhesive member 196 including elastic hollow particles can be disposed above the connection line 150.

For example, the first adhesive member 195 can be coated or formed on the connection line 150 by the inkjet method. The inkjet method enables a selective coating in the second area A2 and large-area printing to optimize the process.

The first adhesive member 195 can include an adhesive having a relatively low shear modulus. For example, the first adhesive member 195 can include an adhesive resin. For example, the first adhesive member 195 can include an optically cleared resin (OCR). For example, the first adhesive member 195 can include an adhesive having a lower shear modulus than that of the second adhesive member 192.

Further, the first adhesive member 195 can be used an inkjet method to be selectively coated (or formed) in a desired area, for example, in the second area A2 in which the deformation is concentrated. Further, the deformation, such as compression of the second area A2 which is deformed during the stretching can be restored without affecting the first area A1 having the rigidity.

In FIG. 4, it is illustrated that the first adhesive member 195 according to an exemplary embodiment of the present disclosure can be coated (or formed) to have substantially the same height (level) as the first pad 131 and the second pad 132 of the first area A1 as an example. For instance, the top surfaces of the first adhesive member 195 is coplanar or substantially coplanar with the top surfaces of the first and second pads 131 and 132. However, it is not limited thereto, and the first adhesive member 195 of the present disclosure can also be coated (or formed) to have a lower height (e.g., top level or upper level) that the first pad 131 and the second pad 132. For instance, the first adhesive member can be disposed to have a top level (or an upper level) that is disposed lower than a top level (or an upper level) of at least one of the first pad and the second pad.

A bank 119 can be disposed on the first pad 131, the second pad 132, and the sixth insulating layer 118. For example, the bank 119 can be configured to include a black material to suppress or prevent light emitted from the light emitting diode from being transmitted to the adjacent sub pixels SPX to cause the mixed color. The bank 119 can be formed of an organic insulating material and can be formed of the same material as the sixth insulating layer 118. For example, the bank 119 can be formed of acrylic resin, or benzocyclobutene (BCB) resin, or polyimide, but it is not limited thereto.

For example, the light emitting diode 140 can be disposed above the first pad 131, the second pad 132, and the sixth insulating layer 118. The light emitting diode 140 can be disposed so as to correspond to each of the plurality of sub pixels SPX, and can be a component which emits light with a specific wavelength range. For example, the light emitting diode 140 can be a blue light emitting diode which emits blue light, a red light emitting diode which emits red light, or a green light emitting diode which emits green light, but is not limited thereto.

The light emitting diode 140 can be configured in various forms based on a type of the display apparatus 100. When the display apparatus 100 is an organic light emitting display apparatus, the light emitting diode 140 can be an organic light emitting diode which includes an anode, an organic emission layer, and a cathode. When the display apparatus 100 is an inorganic light emitting display apparatus, the light emitting diode 140 can be a light emitting diode (LED) including an n-type semiconductor layer, an emission layer, and a p-type semiconductor layer. Hereinafter, even though it is assumed that the light emitting diode 140 is a micro LED configured by the inorganic emission material, the present disclosure is not limited thereto, so that the light emitting diode can be configured by an organic emission material. When the light emitting diode 140 is configured as the micro LED, it is advantageous to suppress or prevent the change in the image quality even by the external impact.

The light emitting diode 140 can include a first semiconductor layer 141, a light emitting layer 142, a second semiconductor layer 143, a first electrode 144, and a second electrode 145.

Hereinafter, for the convenience of description, even though it is assumed that the light emitting diode 140 is a flip-chip type micro LED, the light emitting diode 140 can be a micro LED with a lateral structure or a vertical structure, but is not limited thereto.

The first electrode 144 can be disposed on the first pad 131 and the second electrode 145 can be disposed on the second pad 132. The first electrode 141 and the second electrode 145 can be electrically connected to the first pad 131 and the second pad 132, respectively. For example, the first electrode 144 can transmit a voltage from the drain electrode 124 of the transistor 120 to the first semiconductor layer 141, and the second electrode 145 can transmit the voltage from the common line 127 to the second semiconductor layer 143.

A plurality of connection patterns BP1 and BP2 can be disposed between the first pad 131 and the second pad 132, and the light emitting diode 140. The plurality of connection patterns BP1 and BP2 can be a media for bonding or connecting the plurality of light emitting diodes 140 to the first pad 131 and the second pad 132. For example, the plurality of connection patterns BP1 and BP2 can be a gold (Au) bump or a solder bump, but is not limited thereto.

For example, the plurality of connection patterns BP1 and BP2 can include a first connection pattern BP1 and a second connection pattern BP2. The first connection pattern BP1 can be disposed between the first pad 131 and the first electrode 144, and the second connection pattern BP2 can be disposed between the second pad 132 and the second electrode 145. The plurality of light emitting diodes 140 can be bonded or attached onto the plurality of second substrates 111 by the plurality of connection patterns BP1 and BP2 disposed between the first electrode 144 and the first pad 131, and between the second electrode 145 and the second pad 132. A second connection pattern BP2 disposed between the second electrode 145 and the second pad 132, among the plurality of connection patterns BP1 and BP2 can compensate for a step difference between the second electrode 145 and the second pad 132 of the light emitting diode 140.

The first semiconductor layer 141 can be disposed on the first electrode 144 and the second semiconductor layer 143 can be disposed on the first semiconductor layer 141. For example, the first semiconductor layer 141 and the second semiconductor layer 143 can be formed by injecting n-type or p-type impurities in gallium nitride (GaN). The first semiconductor layer 141 can be a p-type semiconductor layer formed by injecting the p-type impurities into gallium nitride and the second semiconductor layer 143 can be an n-type semiconductor layer formed by injecting the n-type impurities into gallium nitride, but are not limited thereto. For example, the p-type impurity can include magnesium (Mg), zinc (Zn), and beryllium (Be), and the n-type impurity can be silicon (Si), germanium (Ge), and tin (Sn), but are not limited thereto.

The emission layer 142 can be disposed between the first semiconductor layer 141 and the second semiconductor layer 143. The emission layer 142 can be supplied with holes and electrons from the first semiconductor layer 141 and the second semiconductor layer 143 to emit light. The emission layer 142 can be configured as a single layer or a multi-quantum well (MQW) structure. For example, the emission layer 142 can be configured by indium gallium nitride (InGaN) or gallium nitride (GaN), but embodiments of the present disclosure are not limited thereto.

A part of the second semiconductor layer 143 can outwardly protrude from the emission layer 142 and the first semiconductor layer 141. For example, the emission layer 142 and the first semiconductor layer 141 can be smaller than the second semiconductor layer 143 to expose a bottom surface (or a lower surface) of the second semiconductor layer 143. For example, the second semiconductor layer 143 can be exposed from the emission layer 142 and the first semiconductor layer 141 to be electrically connected to the second pad 132.

When the display apparatus 100 is turned on, the plurality of light emitting diodes 140 above the plurality of second substrates 111 can be turned on. For example, different levels of voltages can be applied to the drain electrode 124 and the common line 127 of the transistor 120 which is electrically connected to the plurality of light emitting diodes 140. A voltage from the drain electrode 124 of the transistor 120 can be applied to the first electrode 144 of the light emitting diode 140 and a common voltage from the common line 127 can be applied to the second electrode 145. As the different levels of voltages are applied to the first electrode 144 and the second electrode 145 of the light emitting diode 140, the current flows to the emission layer 142 to allow the light emitting diode 140 to emit light.

The second adhesive member 192 can be disposed on the entire surfaces above the second substrate 111 on which the light emitting diode 140 is disposed, and the connection line 150, and the connection substrate CS in which the first adhesive member 195 is disposed. For example, the second adhesive member 192 can include an adhesive having a relatively high shear modulus. For example, the second adhesive member 192 can include an optically cleared adhesive (OCA). For example, the second adhesive member 192 can include an adhesive having a high shear modulus of approximately $5 \times 10^4$ Pa or more to $10^7$ Pa or less. For example, the second adhesive member 192 can be attached or disposed above the substrate 110 in the entire first area A1 and second area A2 like a tape. For example, the second adhesive member 192 can be commonly disposed above the light emitting diode 140 of the first area A1 and on the first adhesive member 195 of the second area A2, but is not limited thereto.

According to an exemplary embodiment of the present disclosure, the first adhesive member 195 including elastic hollow particles having a high recovery resilience is selectively coated (or formed) above the connection line 150 of the second area A2 of the display apparatus 100. Therefore, when the display apparatus 100 is deformed, the resilience is improved together with the second adhesive member 192 above the first adhesive member 195 to minimize or reduce the deformation to improve the reliability.

According to an exemplary embodiment of the present disclosure, the second adhesive member 192 having a high shear modulus can be laminated on the first adhesive member 195 so that the Z-axis deformation by the flexibility of the first adhesive member 195 having a low shear modulus can be improved. Further, the resilience can be enhanced to improve the compression caused during the stretching.

In the display apparatus 100, the lower the shear modulus of the adhesive and the larger the creep strain, the more excellent the reliability for the repeated stretching. Here, the creep strain can be a degree of deformation over time in a state in which a predetermined load is applied to a material. The creep strain can be viewed as a deformed ratio (%) from the initial state.

In the display apparatus, as the shear modulus of the adhesive is smaller and the creep strain is larger, when upper and lower stretching films and passivation films are removed during the manufacturing process of the display apparatus 100, the creases or marks due to the Z-axis deformation can be caused.

Here, the Z-axis deformation can mean a form in which the matrix itself moves in the Z-axis direction. For example, when it is checked using microscope, it can be confirmed that there is no deformation in the X-axis and the Y-axis, but a partial shade change. It means deformation like a "swaying shape".

Accordingly, in the display apparatus 100, it is understood that the shear modulus of the adhesive has a trade-off relationship between the stretching reliability and the Z-axis deformation.

The display apparatus 100 according to an exemplary embodiment of the present disclosure applies the first adhesive member 195 having a low shear modulus including elastic hollow particles and the second adhesive member 192 having a high shear modulus as stretching films. Thus, it is possible to ensure the stretching reliability and supplement elasticity and improve the Z-axis deformation to improve the reliability.

Further, in the display apparatus 100 according to an exemplary embodiment of the present disclosure, it can be possible to be coated (or formed) in a desired portion with a large area printing by the inkjet without using additional equipment, such as a mask. Accordingly, subsidiary materials, such as a release film and a punching process are not required so that the cost can be saved and the process can be optimized.

The upper substrate 160 can be disposed on the lower substrate 110.

For example, the upper substrate 160 can be disposed on the plurality of light emitting diodes 140 and the first adhesive member 195 of the lower substrate 110 and the second adhesive member 192. The upper substrate 160 can be a substrate which supports various components disposed below the upper substrate 160. The upper substrate 160 which is a flexible substrate can be configured by an insulating material which is bendable or stretchable. The upper substrate 160 can be a flexible substrate so as to be reversibly expanded and contracted. Further, an elastic modulus can be several MPa to several hundreds of MPa and a stretching fracture ratio can be 100% or higher. A thickness of the upper substrate 160 can be 10 μm to 1 mm, but is not limited thereto.

The upper substrate 160 can be formed of the same material as the lower substrate 110 and for example, can be formed of a silicon rubber such as polydimethylsiloxane (PDMS), or an elastomer such as polyurethane (PU). Therefore, the upper substrate 120 can have a flexible property, but it is not limited thereto.

A pressure can be applied to the upper substrate 160 and the lower substrate 110 so that the upper substrate 160 and the lower substrate 110 can be bonded or attached by a second adhesive member 192 disposed below the upper substrate 160. The second adhesive member 192 can have a flexibility to be expanded and/or contracted as the upper substrate 160 expands and/or is contracted. However, embodiments of the present disclosure are not limited thereto, so that the second adhesive member 192 can be omitted based on the exemplary embodiment of the present disclosure.

The polarization layer 165 can be disposed on the upper substrate 160.

The polarization layer 165 can polarize light incident from the outside of the display apparatus 100. The polarized light which passes through the polarization layer 165 to be incident into the display apparatus 100 can be reflected in the display apparatus 100 so that a phase can be shifted. The light with a shifted phase may not pass through the polarization layer 165. Therefore, light which is incident into the display apparatus 100 from the outside of the display apparatus 100 may not be emitted to the outside of the display apparatus 100 so that the external light reflection of the display apparatus 100 can be reduced.

Hereinafter, a manufacturing process of elastic hollow particles of the present disclosure will be described in detail with reference to the drawings.

FIGS. 5A to 5D illustrate a method of forming elastic hollow particles of the present disclosure.

In FIGS. 5A to 5D, polystyrene hollow nanospheres are illustrated as an example of the elastic hollow particles, but it is not limited thereto. For example, polypropylene or polyethylene can be applied.

When a method illustrated in FIGS. 5A to 5D is used, elastic hollow particles of various shapes such as a simple sphere, a complex sphere, or a non-sphere, and polymers and hybrid polymers can be formed. For example, the simple sphere can be one sphere and the complex sphere can be a combination of several spheres.

Figure 5A:
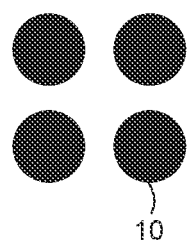
FIGS. 5A to 5D illustrate a method of forming elastic hollow particles of the present disclosure.

First, referring to FIG. 5A, a sacrificial template 10 is prepared.

In order to prepare a spherical particle having a single pore and a single layer or a plurality of layers of polymer shell, silica nano particles (SiNP), magnetic nanoparticles (MNP), or polymer latex particles can be used as the template 10. For example, the shell can be formed of one or more polymers through emulsion polymerization (EP), atom transfer radical polymerization (ATRP), or dispersion polymerization, and layer by layer (LbL) technique.

Figure 5B:
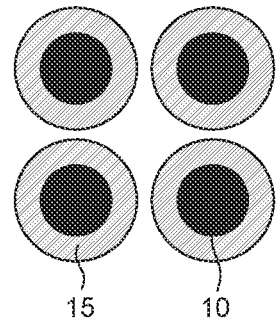

Referring to FIG. 5B, before preparing the polymer shell, for example, a surface of the silica nano particle (SiNP) can be grafted with polymeric silane coupling agents 15.

For example, to prepare monodisperse hollow microporous PS nanospheres (MHMPNS), a $SiO_2$ template 10 was functionalized with 3-methacryloxypropyltrimethoxysilane (MPS) and then can be coated (or formed) with PS through emulsion polymerization.

Figure 5C:
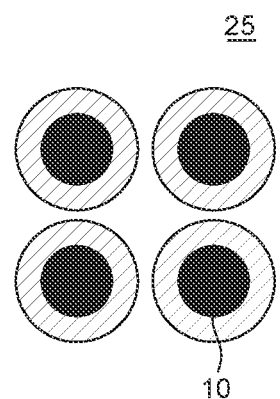

Referring to FIG. 5C, a $SiO_2$ core shell particle 25 after performing intrasphere hyper-cross-linking by the Friedel-Crafts reaction is illustrated.

Figure 5D:
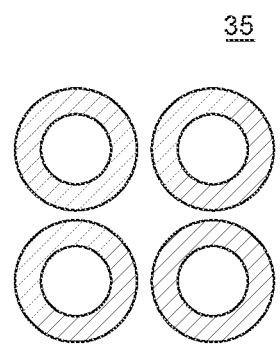

Referring to FIG. 5D, a $SiO_2$ core is etched with hydrofluoric acid (HF) to obtain MHMPNS 35. However, it is not limited thereto so that the MHMPNS 35 can be formed after dissolving the template 10 with strong inorganic acid such as hydrofluoric acid (HF) or hydrochloric acid (HCl), or an organic solvent such as tetrahydrofuran (THF) or N, N-dimethylformamide (DMF).

In the present disclosure, an elastic modulus of the elastic hollow particle can vary according to a condition of an inner diameter or a mixing ratio, which will be described in detail with reference to the drawing.

FIG. 6 is a table showing examples of an elastic modulus and a haze value of a first adhesive member according to a size of an elastic hollow particle and a mixing ratio.

For example, as an elastic hollow particle which serves as a reference, polystyrene having an elastic modulus of $4 \times 10^4$ Pa can be applied.

Referring to FIG. 6, as an evaluation condition, in Experimental Examples 1, 2, 3, and 4, a size of the elastic hollow particle, for example, an inner diameter is 40 nm and a content ratio of the elastic hollow particle is 30 w %, 45 w %, 60 w %, and 75 wt %, respectively.

Further, in Experimental Examples 5, 6, 7, and 8, an inner diameter of the elastic hollow particle is 60 nm and a content ratio of the elastic hollow particle is 30 w %, 45 w %, 60 w %, and 75 wt %, respectively.

In Experimental Examples 9, 10, 11, and 12, an inner diameter of the elastic hollow particle is 100 nm and a content ratio of the elastic hollow particle is 30 w %, 45 w %, 60 w %, and 75 wt %, respectively.

It can be understood that in Experimental Examples 1, 2, 3, and 4, elastic modulus of the first adhesive member is $4 \times 10^4$ Pa, $8 \times 10^4$ Pa, $5 \times 10^5$ Pa, and $1 \times 10^6$ Pa, Tis 70, 80, 90, and 92%, and haze is 10, 5, 0.7, and 0.3, respectively.

It can be understood that in Experimental Examples 5, 6, 7, and 8, elastic modulus of the first adhesive member is $4 \times 10^4$ Pa, $8 \times 10^4$ Pa, $1 \times 10^5$ Pa, and $4 \times 10^5$ Pa, Tis 75, 82, 91, and 93%, and haze is 10, 6, 1, and 0.3, respectively.

It can be understood that in Experimental Examples 9, 10, 11, and 12, elastic modulus of the first adhesive member is $4 \times 10^4$ Pa, $6 \times 10^4$ Pa, $9 \times 10^4$ Pa, and $1 \times 10^5$ Pa, T is 78, 85, 92, and 95%, and haze is 9, 4, 0.7, and 0.3, respectively.

The smaller the particle size, for example, the smaller the inner diameter of the elastic hollow particle, the more the influence on the elastic modulus of the first adhesive member.

Further, to stably implement particles, elastic hollow particles having a predetermined size or larger, for example, an inner diameter of 40 nm or more and an outer diameter of approximately 500 nm can be applied.

The higher the mixing ratio of the elastic hollow particles, the higher the elastic modulus of the first adhesive member, but at less than 60 wt %, haze is generated due to aggregation. Therefore, to form a linear structure of the resin and form a uniform network to implement a low elastic modulus, an amorphous net structure by particles of a predetermined wt % or higher, for example, 60 wt % or higher can be necessary.

The first adhesive member of the exemplary embodiment of the present disclosure can be coated (or formed) to have substantially the same height as the first pad and the second pad of the first area, but it is not limited thereto. Therefore, the first adhesive member can be coated (or formed) to have a lower height than the first pad and the second pad, which will be described in detail with reference to the following drawings.

Figure 7:
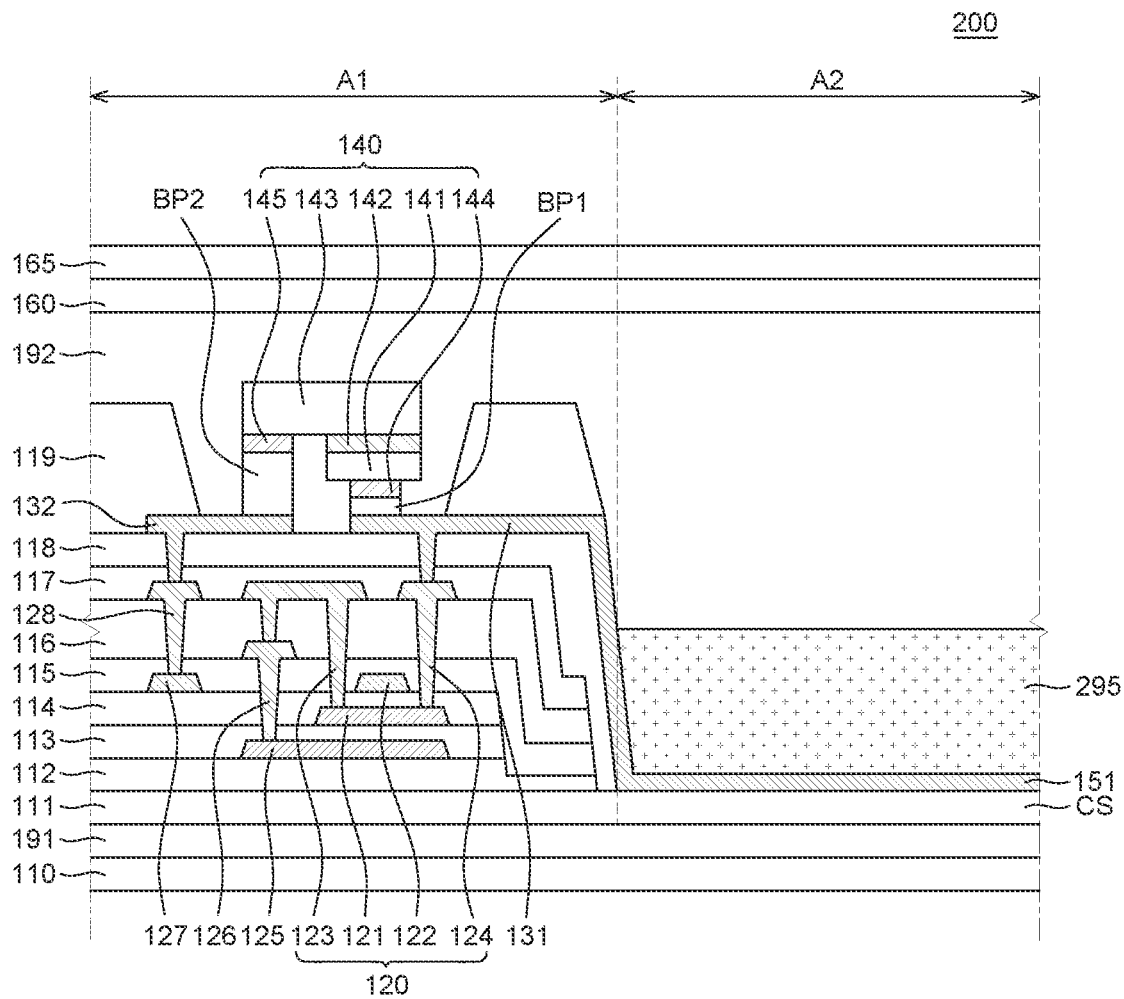
FIG. 7 is a cross-sectional view of a part of a display apparatus according to another embodiment of the present disclosure.

FIG. 7 is a cross-sectional view of a part of a display apparatus according to another embodiment of the present disclosure.

A display apparatus 200 according to another exemplary embodiment of FIG. 7 has a different configuration of a first adhesive member 295 from that the electroluminescent display apparatus 100 of one exemplary embodiment of FIG. 4 described above, but the other configurations are substantially the same. Therefore, a redundant description will be omitted as much as possible.

Referring to FIG. 7, the lower substrate 110 can include a plurality of first areas A1 in which the plurality of second substrates 111 is disposed and a plurality of second areas A2 in which a plurality of connection lines (150 in FIG. 3) is disposed.

For example, the plurality of first areas A1 of the lower substrate 110 can be areas in which the plurality of second substrates 111 is disposed and can have a rigidity.

The plurality of pixels (PX of FIG. 3) including a plurality of sub pixels (SPX of FIG. 3) can be included in the plurality of second substrates 111 of the plurality of first areas A1. For example, in each of the plurality of sub pixels SPX, a plurality of light emitting diodes 140 and various driving elements for driving the plurality of light emitting diodes 140 can be disposed, and each of the plurality of sub pixels SPX can be connected to various wiring lines.

For example, the lower substrate 110 can include the plurality of second areas A2 to be adjacent to the plurality of first areas A1.

For example, the plurality of second areas A2 is areas in which the plurality of connection lines 150 and the plurality of connection substrates CS are disposed and has a flexibility.

For example, the plurality of connection lines 150 and the plurality of connection substrates CS can be disposed in the plurality of second areas A2 of the lower substrate 110. The plurality of connection lines 150 can be disposed above the plurality of connection substrates CS.

The plurality of connection substrates CS can have a wavy shape or a curved shape. Accordingly, the plurality of connection lines 150 disposed above the plurality of connection substrates CS can have a wavy shape or a curved shape like the plurality of connection substrates CS. When the plurality of connection lines 150 has a wavy shape or a curved shape, a performance of the display apparatus can be maintained even though they are repeatedly bent or folded of the display apparatus.

For example, the plurality of connection lines 150 can be formed of a conductive material. The connection line 150 can be formed of the same material as various conductive components disposed on the plurality of second substrates 111 and for example, can be formed of a metal material, but is not limited thereto, and can include a base polymer and conductive particles dispersed in the base polymer.

The first adhesive member 295 including elastic hollow particles can be disposed above the connection line 150.

For example, the first adhesive member 295 can be coated or formed on the connection line 150 by the inkjet method.

The first adhesive member 295 can include an adhesive having a relatively low shear modulus. For example, the first adhesive member 295 can include an adhesive resin. For example, the first adhesive member 295 can include an optically cleared resin (OCR). For example, the first adhesive member 295 can include an adhesive having a lower shear modulus than the adhesive of the second adhesive member 192.

According to another exemplary embodiment of the present disclosure, the first adhesive member 295 can be coated (or formed) to have a lower height (level) than the first pad 131 and the second pad 132.

For example, the first adhesive member 295 according to another exemplary embodiment of the present disclosure can be coated (or formed) with a height set to improve the Z-axis deformation while ensuring the stretching reliability. The first adhesive member 295 can be coated (or formed) to have a higher height than the first pad 131 and the second pad 132 of the first area A1.

The second adhesive member 192 can be formed on the entire surface above the second substrate 111 on which the light emitting diode 140 is disposed and the connection substrate CS on which the first adhesive member 295 is disposed. For example, the second adhesive member 192 can include an adhesive having a relatively high shear modulus. For example, the second adhesive member 192 can have an elastic modulus of approximately $5 \times 10^4$ Pa or more to $10^7$ Pa or less, and can include an adhesive having an elastic modulus higher than that of the adhesive of the first adhesive member 295.

The elastic hollow particle according to an exemplary embodiment of the present disclosure can be added to anywhere of the second area in which the connection line is disposed, other than the first adhesive member, which will be described in detail with reference to FIG. 8.

Figure 8:
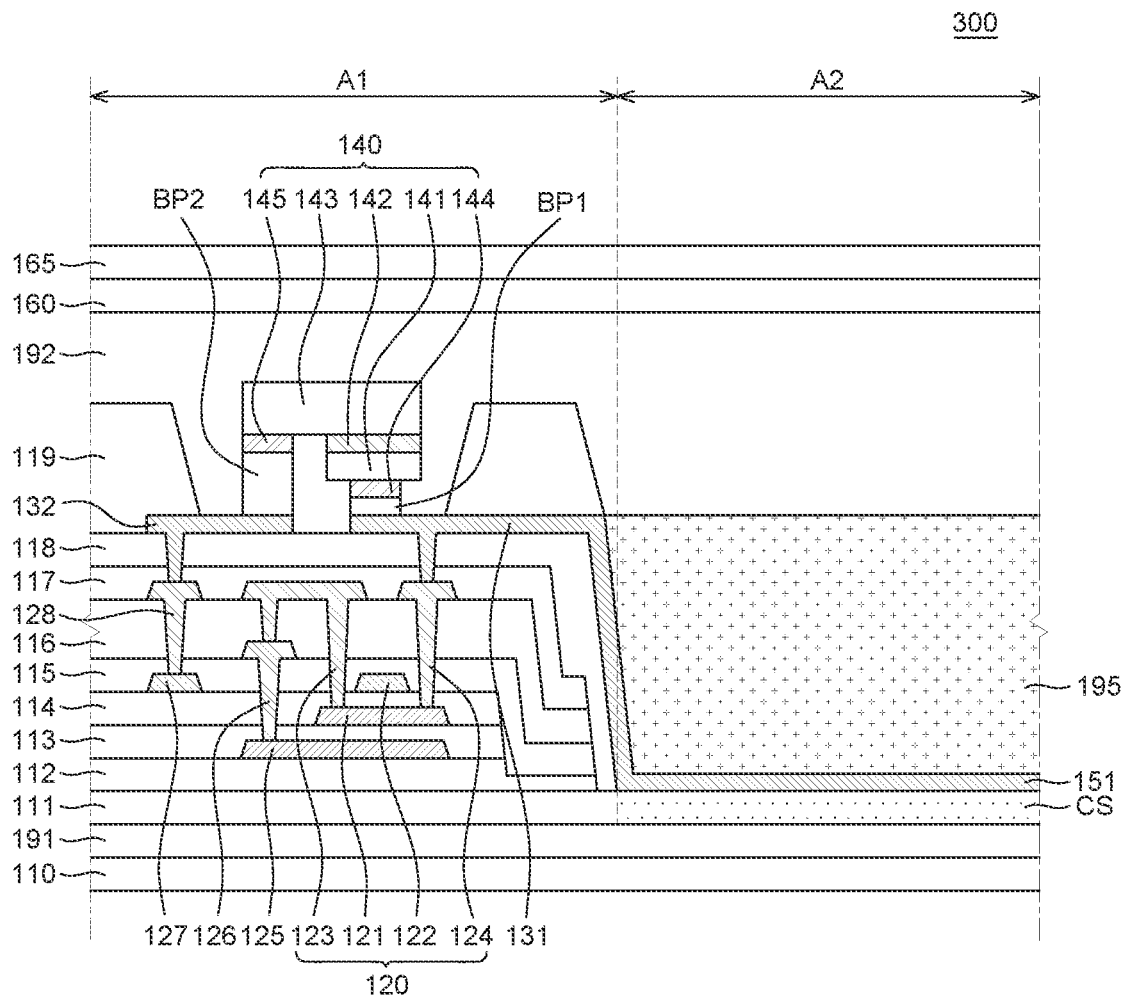
FIG. 8 is a cross-sectional view of a part of a display apparatus according to still another embodiment of the present disclosure.

FIG. 8 is a cross-sectional view of a part of a display apparatus according to still another embodiment of the present disclosure.

A display apparatus 300 according to another exemplary embodiment of FIG. 8 has a different configuration of a connection substrate CS from that of the display apparatus 100 of one exemplary embodiment of FIG. 4 described above, but the other configurations are substantially the same. Therefore, a redundant description can be omitted or may be briefly provided.

Referring to FIG. 8, the lower substrate 110 can include a plurality of first areas A1 in which the plurality of second substrates 111 is disposed and a plurality of second areas A2 in which a plurality of connection lines (150 in FIG. 3) is disposed.

For example, the plurality of first areas A1 of the lower substrate 110 can be areas in which the plurality of second substrates 111 is disposed, and can have a rigidity.

The plurality of pixels (PX of FIG. 3) including a plurality of sub pixels (SPX of FIG. 3) can be included in the plurality of second substrates 111 of the plurality of first areas A1. For example, in each of the plurality of sub pixels SPX, a plurality of light emitting diodes 140 and various driving elements for driving the plurality of light emitting diodes 140 can be disposed and each of the plurality of sub pixels SPX can be connected to various wiring lines.

For example, the lower substrate 110 can include the plurality of second areas A2 to be adjacent to the plurality of first areas A1.

For example, the plurality of second areas A2 can be areas in which the plurality of connection lines 150 and the plurality of connection substrates CS are disposed and can have a flexibility.

For example, the plurality of connection lines 150 and the plurality of connection substrates CS can be disposed in the plurality of second areas A2 of the lower substrate 110. The plurality of connection lines 150 can be disposed on the plurality of connection substrates CS.

The plurality of connection substrates CS can have a wavy shape or a curved shape. Accordingly, the plurality of connection lines 150 disposed above the plurality of connection substrates CS can have a wavy shape or a curved shape like the plurality of connection substrates CS. When the plurality of connection lines 150 has a wavy shape or a curved shape, a performance of the display apparatus can be maintained even though the display apparatus is repeatedly bent or folded.

For example, the plurality of connection lines 150 can be formed of a conductive material. The connection line 150 can be formed of the same material as various conductive components disposed above the plurality of second substrates 111 and for example, can be formed of a metal material, but is not limited thereto, and can include a base polymer and conductive particles dispersed in the base polymer.

According to another exemplary embodiment of the present disclosure, the plurality of connection substrates CS can include elastic hollow particles.

According to another exemplary embodiment of the present disclosure, the first adhesive member 195 and the connection substrate CS including elastic hollow particles can be disposed on and below the connection line 150 so that the resilience against the stretching and/or elasticity are further enhanced to minimize or reduce the deformation. Thus, the reliability can be further improved.

The first adhesive member 196 including elastic hollow particles can be disposed above the connection line 150.

The elastic hollow particles in the connection substrate CS and the first adhesive member 195 can include hollow nanospheres of polystyrene, polypropylene, or polyethylene.

For example, the elastic hollow particles can be configured by various shapes, such as a simple sphere, a complex sphere, or a non-sphere, and polymers and hybrid polymers.

For example, the elastic hollow particle can have a size of an inner diameter of 40 nm or larger and an outer diameter of approximately 500 nm.

For example, the elastic hollow particles can have amorphous net structure having a mixing ratio of 60 wt % or higher.

For example, the first adhesive member 195 can be coated (or formed) above the connection line 150 by the inkjet method.

The first adhesive member 195 can include an adhesive having a relatively low shear modulus. For example, the first adhesive member 195 can include an adhesive resin. For example, the first adhesive member 195 can include an optically cleared resin (OCR). For example, the first adhesive member 195 can include an adhesive having a lower shear modulus than the adhesive of the second adhesive member 192.

In FIG. 8, even though it is illustrated that the first adhesive member 195 of another exemplary embodiment of the present disclosure is coated (or formed) to have substantially the same height (e.g., level) as the first pad 131 and the second pad 132 of the first area A1 as an example, it is not limited thereto. The first adhesive member 195 of the present disclosure can be coated (or formed) to have a height (e.g., level) lower than the first pad 131 and the second pad 132 or coated (or formed) to have a height higher than the first pad 131 and the second pad 132 of the first area A1.

The second adhesive member 192 can be disposed on the entire surfaces above the second substrate 111 on which the light emitting diode 140 is disposed and the connection substrate CS on which the first adhesive member 195 is disposed. For example, the second adhesive member 192 can include an adhesive having a relatively high shear modulus. For example, the second adhesive member 192 can have an elastic modulus of approximately $5 \times 10^4$ Pa or more to $10^7$ Pa or less, and can include an adhesive having an elastic modulus higher than that of the adhesive of the first adhesive member 295.

Exemplary embodiments of the present disclosure can also be described as follows.

A display apparatus according to some embodiments of the present disclosure can include a first substrate including a plurality of first areas and a plurality of second areas around or adjacent to the plurality of first areas, a second substrate disposed in the plurality of first areas, a connection substrate disposed in the plurality of second areas, a light emitting diode disposed over the second substrate, a connection line disposed over the connection substrate, a first adhesive member disposed over the connection line and including elastic hollow particles, a second adhesive member disposed over the light emitting diode and the first adhesive member, and a third substrate disposed over the second adhesive member.

According to some embodiments of the present disclosure, the first substrate and the third substrate can be configured by a silicon rubber of a polydimethylsiloxane, a polyurethane, or a polytetrafluoroethylene.

According to some embodiments of the present disclosure, the second substrate can have a rigidity larger than a rigidity of the first substrate.

According to some embodiments of the present disclosure, the second substrate can be configured by a polyimide, a polyacrylate, or a polyacetate.

According to some embodiments of the present disclosure, the second substrate can have an elastic modulus higher than an elastic modulus of the first substrate.

According to some embodiments of the present disclosure, the connection substrate can connect the second substrates adjacent to each other and the connection substrate can have a curved shape.

According to some embodiments of the present disclosure, the first adhesive member can be disposed over the connection line by an inkjet method.

According to some embodiments of the present disclosure, the first adhesive member can include an adhesive resin and the second adhesive member can include an adhesive or an optically cleared adhesive (OCA).

According to some embodiments of the present disclosure, the second adhesive member can have shear modulus of about $5 \times 10^4$ Pa or more to less than about $10^7$ Pa and the first adhesive member can have a shear modulus lower than a shear modulus of the second adhesive member.

According to some embodiments of the present disclosure, the display apparatus can further include a transistor disposed over the second substrate, a first pad disposed over the transistor and connected to the transistor and the light emitting diode, and a second pad disposed over the transistor and connected to the light emitting diode and the common line.

According to some embodiments of the present disclosure, the first adhesive member can be disposed to have a height (e.g., level) corresponding to at least one of the first pad and the second pad.

According to some embodiments of the present disclosure, the first adhesive member can be disposed to have a height (e.g., level) lower than the first pad and the second pad. The first adhesive member may be disposed to have an upper level that is disposed lower than an upper level of at least one of the first pad and the second pad.

According to some embodiments of the present disclosure, the elastic hollow particles can have a shape of a simple sphere, a complex sphere, or a non-sphere, and can be configured by at least one hollow nanosphere among a polystyrene, a polypropylene, and a polyethylene.

According to some embodiments of the present disclosure, the elastic hollow particles can have an inner diameter of 40 nm or more and an outer diameter of 500 nm to 1000 nm.

According to some embodiments of the present disclosure, the elastic hollow particles can have an amorphous net structure having a mixing ratio of 60 wt % or more.

According to some embodiments of the present disclosure, the connection substrate can include the elastic hollow particles.

A display apparatus according to some embodiments of the present disclosure can include a plurality of second substrates disposed over a first substrate, a plurality of connection substrates connected to the second substrates adjacent to each other among the plurality of second substrates, a plurality of connection lines disposed over the plurality of connection substrates and electrically connected to pads disposed in the second substrates being adjacent to each other, a first adhesive member disposed over the plurality of connection lines and including elastic hollow particles, a second adhesive member including the first adhesive member disposed over the first substrate, and a third substrate disposed over the second adhesive member. The first adhesive member can include an adhesive having a shear modulus lower than that of the second adhesive member.

According to some embodiments of the present disclosure, the first adhesive member can be disposed over at least one of the plurality of connection lines by an inkjet method.

According to some embodiments of the present disclosure, the first adhesive member can include an adhesive resin and the second adhesive member can include an adhesive or optically cleared adhesive (OCA).

According to some embodiments of the present disclosure, the second adhesive member can have a shear modulus of $5 \times 10^4$ Pa or more to less than $10^7$ Pa.

A display apparatus according to some embodiments of the present disclosure can include a first substrate including a plurality of first areas and a plurality of second areas adjacent to the plurality of first areas, a plurality of second substrates disposed in the plurality of first areas, respectively, a light emitting layer disposed over the plurality of second substrate, a connection line disposed over the plurality of second areas of the first substrate, a first adhesive member disposed over the connection line, a second adhesive member disposed over the light emitting layer and the first adhesive member, and a third substrate disposed over the second adhesive member. An upper surface of the light emitting layer and an upper surface of the connection line can be disposed on the same plane.

According to some embodiments of the present disclosure, the first adhesive member can include elastic hollow particles According to some embodiments of the present disclosure, the first substrate and the third substrate can be configured by a silicon rubber of polydimethylsiloxane, a polyurethane, or a polytetrafluoroethylene.

According to some embodiments of the present disclosure, the second substrate can have a rigidity larger than a rigidity of the first substrate.

According to some embodiments of the present disclosure, the second substrate can be configured by a polyimide, a polyacrylate, or a polyacetate.

According to some embodiments of the present disclosure, the first adhesive member can have a shear modulus lower than a shear modulus of the second adhesive member.

According to some embodiments of the present disclosure, the first adhesive member can have a shear modulus lower than a shear modulus of the second adhesive member.

According to some embodiments of the present disclosure, the elastic hollow particles can have a shape of a simple sphere, a complex sphere, or a non-sphere, and are configured by at least one hollow nanosphere among a polystyrene, a polypropylene, and a polyethylene.

According to some embodiments of the present disclosure, the elastic hollow particles can have an amorphous net structure having a mixing ratio of 60 wt % or more.

It will be apparent to those skilled in the art that various modifications and variations can be made in the present disclosure without departing from the scope of the present disclosure. Thus, it is intended that the present disclosure covers the modifications and variations of this disclosure provided they come within the scope of the appended claims and their equivalents.

What is claimed is:

1. A display apparatus, comprising:
   a first substrate including a plurality of first areas and a plurality of second areas adjacent to the plurality of first areas;
   a second substrate disposed in the plurality of first areas;
   a connection substrate disposed in the plurality of second areas;
   a light emitting diode disposed over the second substrate;
   a connection line disposed over the connection substrate;
   a first adhesive member disposed over the connection line, the first adhesive member including elastic hollow particles;
   a second adhesive member disposed over the light emitting diode and the first adhesive member; and
   a third substrate disposed over the second adhesive member.

2. The display apparatus of claim 1, wherein the first substrate and the third substrate are configured by a silicon rubber of polydimethylsiloxane, a polyurethane, or a polytetrafluoroethylene.

3. The display apparatus of claim 1, wherein the second substrate has a rigidity larger than a rigidity of the first substrate.

4. The display apparatus of claim 1, wherein the second substrate is configured by a polyimide, a polyacrylate, or a polyacetate.

5. The display apparatus of claim 1, wherein the second substrate has an elastic modulus higher than an elastic modulus of the first substrate.

6. The display apparatus of claim 1, wherein the connection substrate connects second substrates adjacent to each other and the connection substrate has a curved shape.

7. The display apparatus of claim 1, wherein the first adhesive member is disposed over the connection line by an inkjet method.

8. The display apparatus of claim 1, wherein the first adhesive member includes an adhesive resin and the second adhesive member includes an optically cleared adhesive (OCA).

9. The display apparatus of claim 1, wherein the second adhesive member has a shear modulus of about $5 \times 10^4$ Pa or more to less than about $10^7$ Pa, and
   wherein the first adhesive member has a shear modulus lower than a shear modulus of the second adhesive member.

10. The display apparatus of claim 1, further comprising:
    a transistor disposed over the second substrate;
    a first pad disposed over the transistor and connected to the transistor and the light emitting diode; and
    a second pad disposed over the transistor and connected to the light emitting diode and the common line.

11. The display apparatus of claim 10, wherein the first adhesive member is disposed to have a height corresponding to at least one of the first pad and the second pad.

12. The display apparatus of claim 10, wherein the first adhesive member is disposed to have an upper level that is disposed lower than an upper level of at least one of the first pad and the second pad.

13. The display apparatus of claim 1, wherein the elastic hollow particles have a shape of a simple sphere, a complex sphere, or a non-sphere, and are configured by at least one hollow nanosphere among a polystyrene, a polypropylene, and a polyethylene.

14. The display apparatus of claim 1, wherein the elastic hollow particles have an inner diameter of about 40 nm or more and an outer diameter of about 500 nm to 1000 nm.

15. The display apparatus of claim 1, wherein the elastic hollow particles have an amorphous net structure having a mixing ratio of about 60 wt % or more.

16. The display apparatus of claim 13, wherein the connection substrate includes the elastic hollow particles.

17. A display apparatus, comprising:
- a plurality of second substrates disposed over a first substrate;
- a plurality of connection substrates connected to the second substrates adjacent to each other among the plurality of second substrates;
- a plurality of connection lines disposed over the plurality of connection substrates and electrically connected to pads disposed in the second substrates being adjacent to each other;
- a first adhesive member disposed over the plurality of connection lines and including elastic hollow particles;
- a second adhesive member including the first adhesive member disposed over the first substrate; and
- a third substrate disposed over the second adhesive member, wherein the first adhesive member includes an adhesive having a shear modulus lower than a shear modulus of the second adhesive member.

18. The display apparatus of claim 17, wherein the first adhesive member is disposed over at least one of the plurality of connection lines by an inkjet method.

19. The display apparatus of claim 17, wherein the first adhesive member includes an adhesive resin and the second adhesive member includes an optically cleared adhesive (OCA).

20. The display apparatus of claim 17, wherein the second adhesive member has the shear modulus of about $5 \times 10^4$ Pa or more to about less than $10^7$ Pa.

* * * * *